(12) United States Patent
Naritomi et al.

(10) Patent No.: US 8,932,719 B2
(45) Date of Patent: Jan. 13, 2015

(54) ALUMINUM ALLOY COMPOSITE AND METHOD FOR JOINING THEREOF

(75) Inventors: Masanori Naritomi, Tokyo (JP); Naoki Andoh, Tokyo (JP)

(73) Assignee: Taisei Plas Co., Ltd., Tokyo (JP)

( * ) Notice: Subject to any disclaimer, the term of this patent is extended or adjusted under 35 U.S.C. 154(b) by 966 days.

(21) Appl. No.: 12/530,940

(22) PCT Filed: Mar. 12, 2008

(86) PCT No.: PCT/JP2008/054539
§ 371 (c)(1),
(2), (4) Date: Sep. 11, 2009

(87) PCT Pub. No.: WO2008/114669
PCT Pub. Date: Sep. 25, 2008

(65) Prior Publication Data
US 2010/0098910 A1 Apr. 22, 2010

(30) Foreign Application Priority Data

Mar. 12, 2007 (JP) ................................. 2007-062376

(51) Int. Cl.
| | | |
|---|---|---|
| B32B 15/092 | (2006.01) | |
| B32B 15/20 | (2006.01) | |
| C23C 8/10 | (2006.01) | |
| B32B 43/00 | (2006.01) | |
| B32B 7/12 | (2006.01) | |
| B32B 15/08 | (2006.01) | |
| B32B 27/04 | (2006.01) | |
| C09J 163/00 | (2006.01) | |
| C23C 22/83 | (2006.01) | |
| C23F 1/36 | (2006.01) | |
| H05K 3/38 | (2006.01) | |
| B32B 38/08 | (2006.01) | |
| H05K 1/05 | (2006.01) | |

(52) U.S. Cl.
CPC . *B32B 43/00* (2013.01); *B32B 7/12* (2013.01); *B32B 15/08* (2013.01); *B32B 27/04* (2013.01); *C09J 163/00* (2013.01); *C23C 22/83* (2013.01); *C23F 1/36* (2013.01); *H05K 3/383* (2013.01); *B32B 38/08* (2013.01); *H05K 1/056* (2013.01); *H05K 3/385* (2013.01); *H05K 3/386* (2013.01); *H05K 2203/0315* (2013.01)
USPC ............. 428/416; 148/275; 148/285; 216/35; 252/79.2; 252/79.5; 428/418

(58) Field of Classification Search
USPC .................. 428/413, 416, 418; 148/275, 285; 216/35; 252/79.2, 79.5
See application file for complete search history.

(56) References Cited

U.S. PATENT DOCUMENTS

| | | | | |
|---|---|---|---|---|
| 3,409,497 A | * | 11/1968 | Roseland | 442/333 |
| 3,531,332 A | * | 9/1970 | Anthony et al. | 148/274 |
| 3,853,690 A | * | 12/1974 | McGarry et al. | 428/416 |
| 5,691,037 A | * | 11/1997 | McCutcheon et al. | 428/172 |
| 2004/0062943 A1 | | 4/2004 | Naritomi et al. | |
| 2006/0127684 A1 | | 6/2006 | Naritomi et al. | |
| 2006/0257624 A1 | | 11/2006 | Naritomi et al. | |
| 2008/0127479 A1 | | 6/2008 | Naritomi et al. | |

FOREIGN PATENT DOCUMENTS

| | | |
|---|---|---|
| JP | 5-70741 A | 3/1993 |
| JP | 9-314744 A | 12/1997 |
| JP | 2002-120002 A | 4/2002 |
| JP | 2003-321784 A | 11/2003 |
| JP | 2004-216425 A | 8/2004 |
| JP | 2006-27018 A | 2/2006 |
| JP | 2006-281961 A | 10/2006 |
| JP | 2006-329410 A | 12/2006 |
| JP | 2006-345273 A | 12/2006 |
| JP | 2007-50630 A | 3/2007 |
| WO | 03/064150 A1 | 8/2003 |
| WO | 2004/041532 A1 | 5/2004 |
| WO | 2004/041533 A1 | 5/2004 |
| WO | 2008/081933 A1 | 7/2008 |

OTHER PUBLICATIONS

International Search Report of PCT/JP2008/054539, date of mailing Jun. 24, 2008.
Notice of Allowance dated Jul. 7, 2014, issued in related U.S. Appl. No. 13/836,410, 7 pages.

\* cited by examiner

*Primary Examiner* — Callie Shosho
*Assistant Examiner* — John Freeman
(74) *Attorney, Agent, or Firm* — Westerman, Hattori, Daniels & Adrian, LLP

(57) ABSTRACT

The object of the present invention is to strongly join an aluminum alloy part with an FRP prepreg. An object obtained by subjecting an aluminum alloy to a suitable liquid treatment so as to form a surface having large, micron-order irregularities and also fine irregularities with a period of several tens of nanometers, eliminating the presence of sodium ions from the surface and additionally forming a surface film of aluminum oxide, which is thicker than a natural oxide layer, has been found to have a powerful adhesive strength with epoxy-based adhesives. By simultaneously curing an FRP prepreg which uses the same epoxy-based adhesive in the matrix, an integral composite or structure in which FRP and aluminum alloy have been united at a joining strength of unprecedented magnitude is produced.

7 Claims, 12 Drawing Sheets

FIG.6
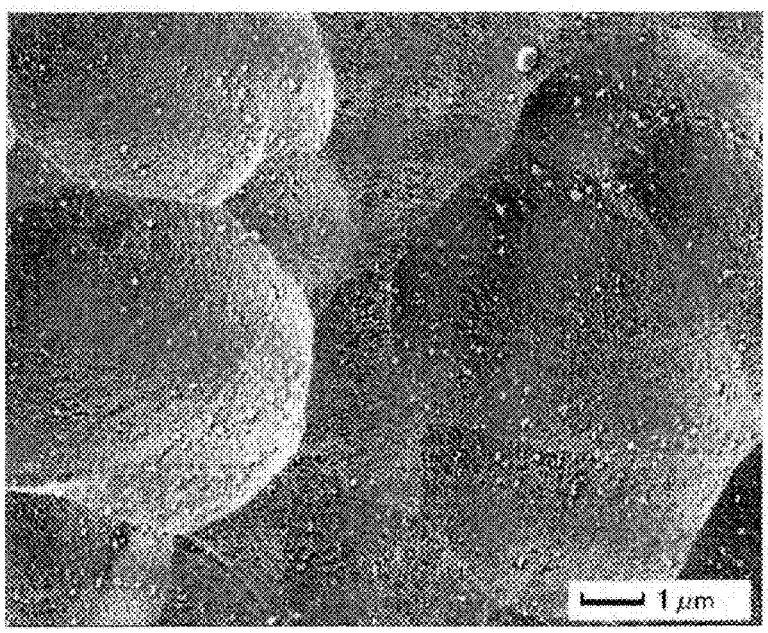
APPARATUS: JSM 7401F
ACCELERATION VOLTAGE (kV):2.0
MAGNIFICATION: ×10,000
IMAGE: LEI
LOWER DETECTOR
DATE OF MEASUREMENT:2006/11/28
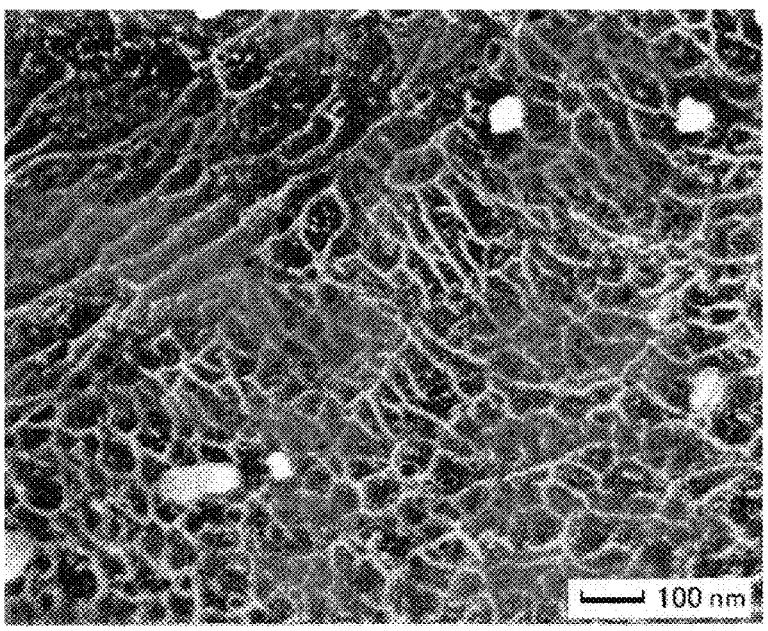
APPARATUS: JSM 7401F
ACCELERATION VOLTAGE (kV):2.0
MAGNIFICATION: ×100,000
IMAGE: SEI
SECONDARY ELECTRON IMAGE
DATE OF MEASUREMENT:2006/11/28

FIG.7
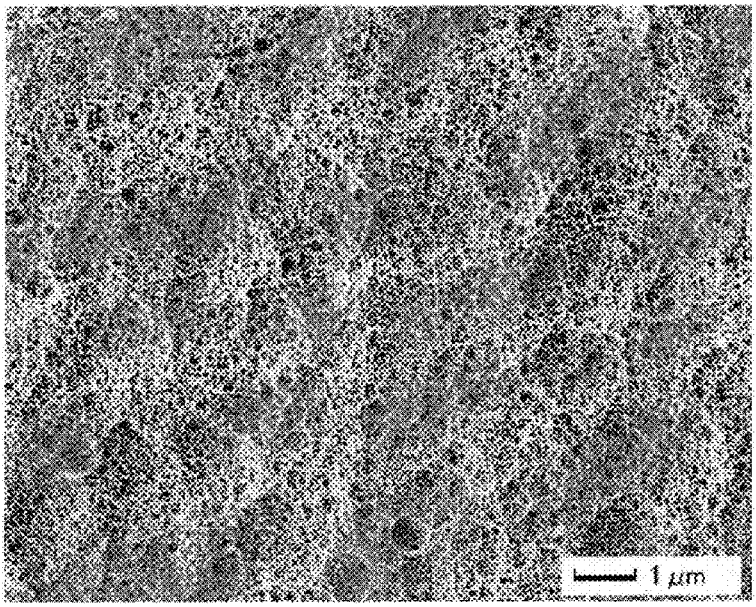
APPARATUS: JSM 7401F
ACCELERATION VOLTAGE (kV):2.0
MAGNIFICATION: ×10,000
IMAGE: LEI
LOWER DETECTOR
DATE OF MEASUREMENT:2006/11/09
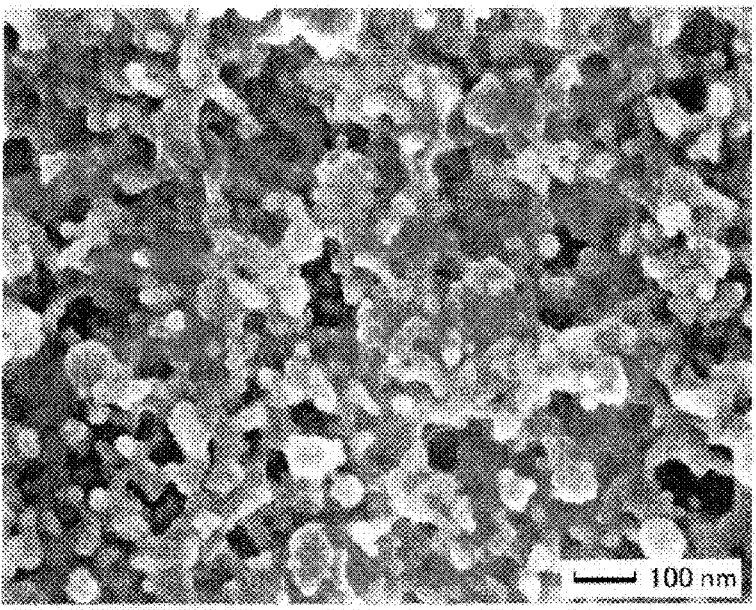
APPARATUS: JSM 7401F
ACCELERATION VOLTAGE (kV):2.0
MAGNIFICATION: ×100,000
IMAGE: SEI
SECONDARY ELECTRON IMAGE
DATE OF MEASUREMENT:2006/11/10

FIG.8
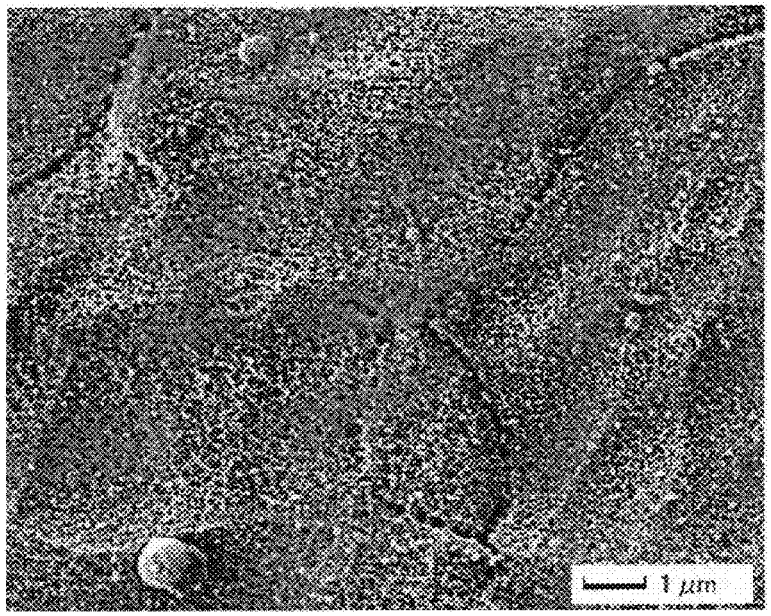
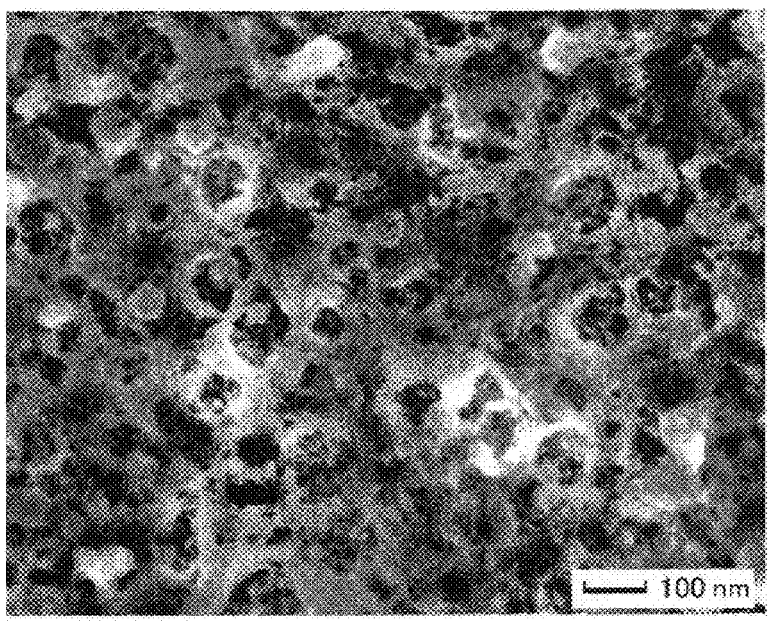

FIG.9
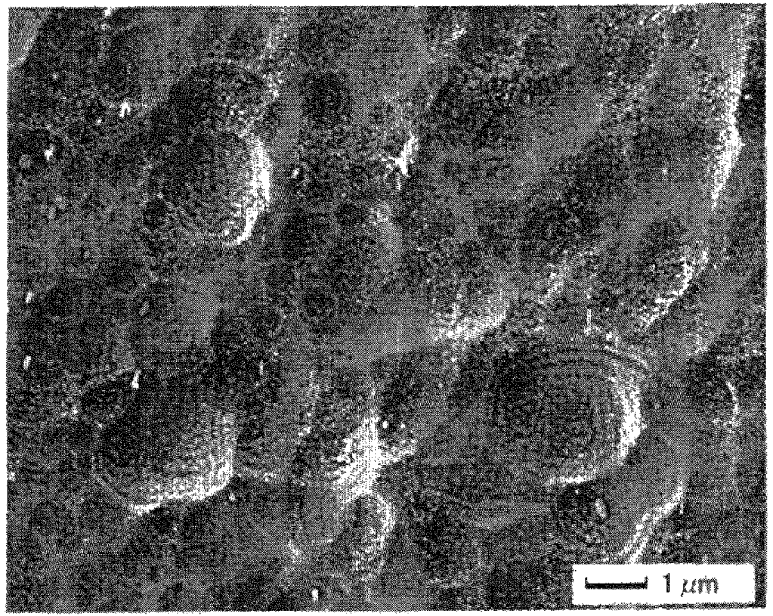
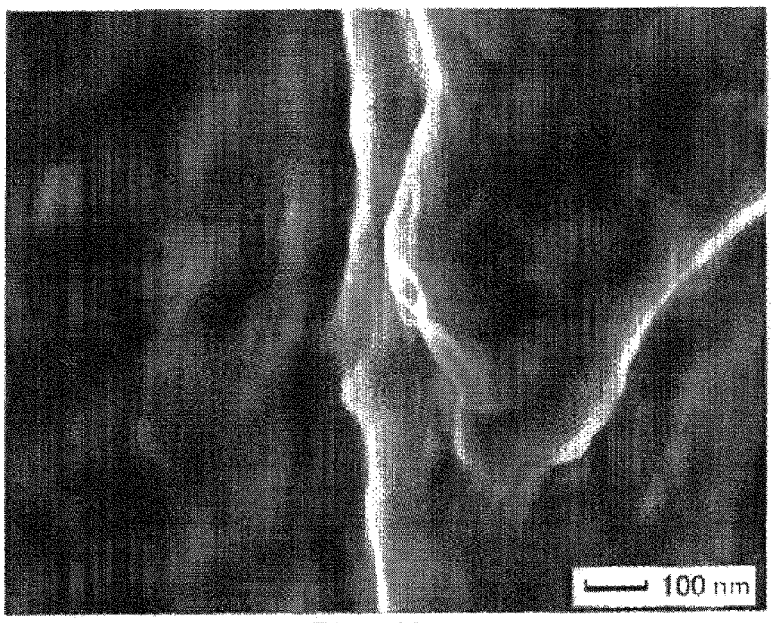

FIG.10
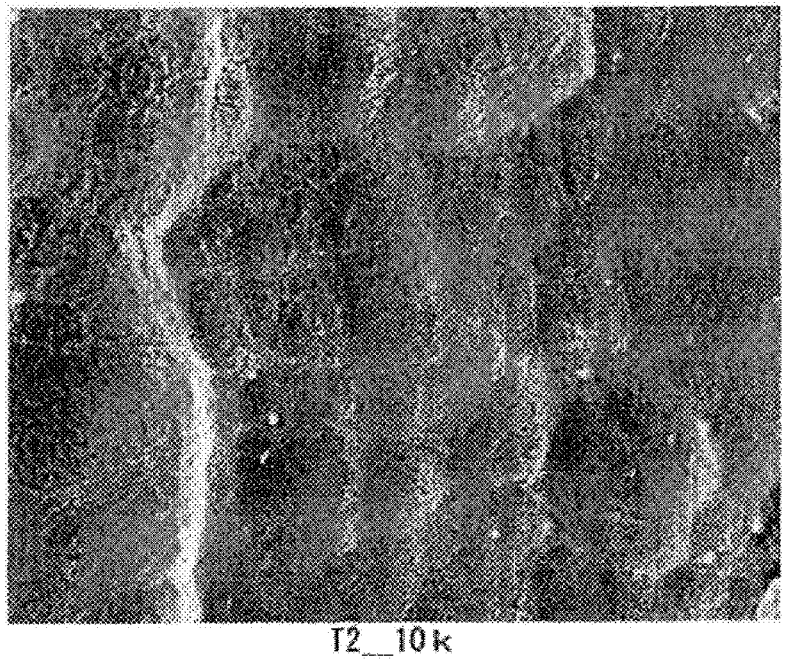
T2_10k
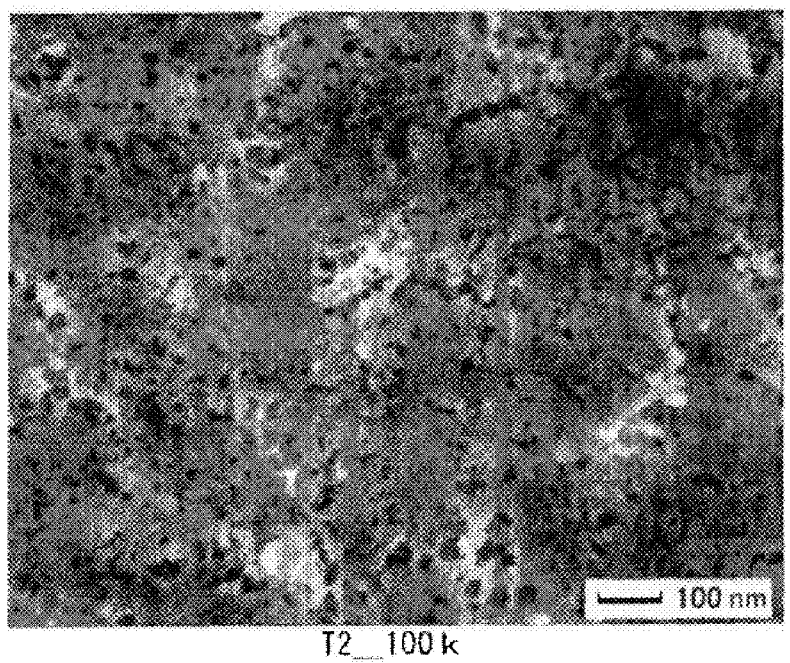
T2_100k

FIG.11
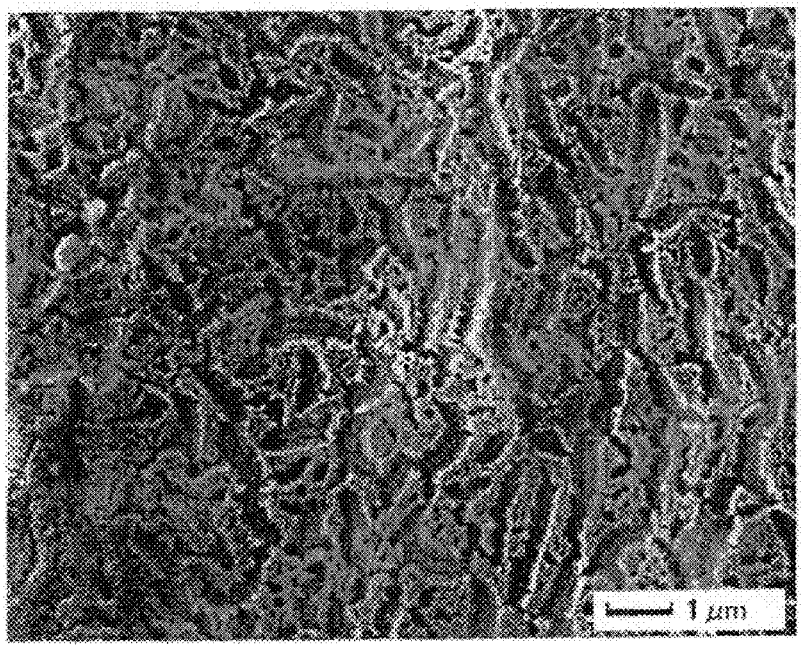
T4_10k
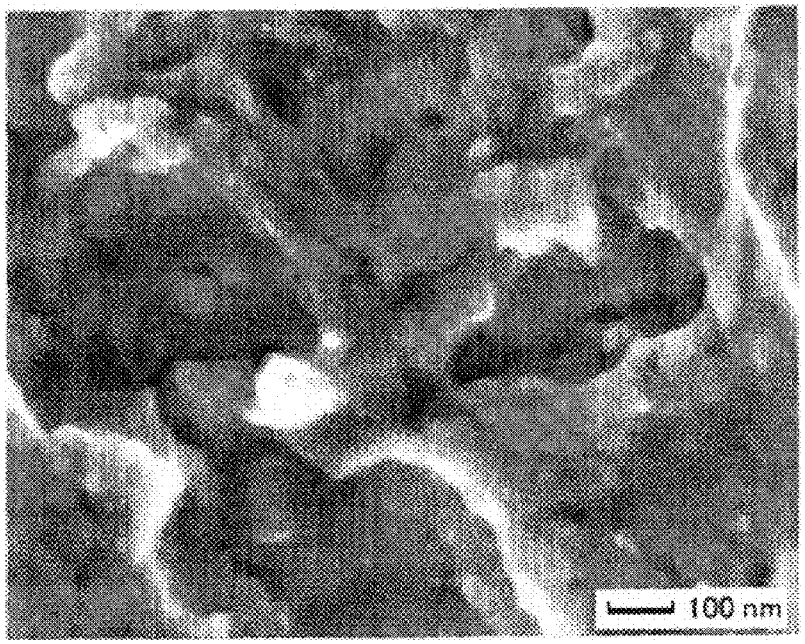
T4_100k

FIG.12
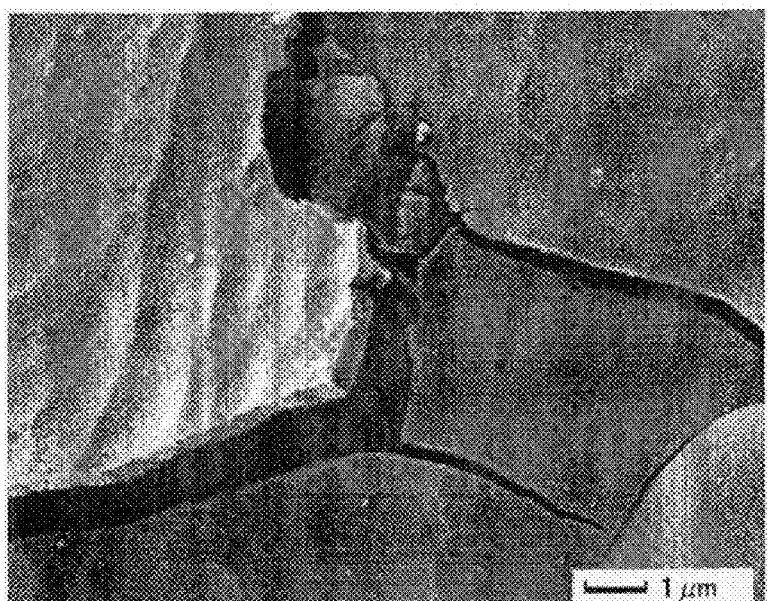
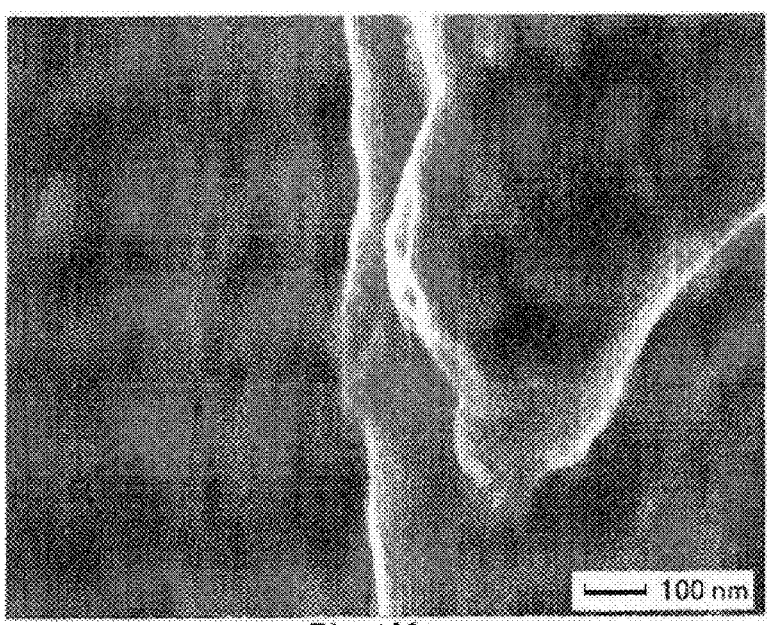

IMMERSION TIME

IMMERSION TIME

ALUMINUM ALLOY COMPOSITE AND METHOD FOR JOINING THEREOF

FIELD OF THE INVENTION

The present invention relates to methods for joining metals with metals or metals with plastics that are used in transportation machinery, electrical equipments, medical instruments, general machinery, other industrial machinery, consumer equipments or the like; to composites thereof; and to methods for manufacturing the same. More specifically, the present invention relates to aluminum alloy composites and joining methods for integrally joining optimal aluminum alloy parts and plastic parts together, suitable for use as transportation machinery components that are required to be lightweight, such as automotive parts and aircraft parts.

BACKGROUND OF THE INVENTION

With the recent rise of energy prices, further technical innovations are being sought in aircraft. That is, in the new model aircraft and the new model concepts recently announced by the Boeing Company (U.S.) and Airbus (France), the utilization of aluminum alloys such as extra super duralumin (designated as "A7075" according to the Japanese Industrial Standards (JIS)) and extra duralumin (similarly designated as "A2024") for reducing the weight of the fuselage has been abruptly decreased and the utilization of carbon fiber reinforced plastic (abbreviated below as "CFRP") is being increased by a corresponding amount.

A7075 (extra super duralumin), which is one type of aluminum alloy, has a specific gravity of about 2.7, whereas CFRP has a specific gravity of 1.6 to 1.7, making it incomparably lighter. Up until now, the utilization of CFRP as a material for aircraft has been increased in military applications such as fighter planes and combat helicopters, while use as a civilian aircraft material has not grown so much as anticipated due to the need to develop know-how on manufacturing large components and because of obstacles from the standpoint of cost. The use of CFRP has been avoided in civilian applications, in spite of their light weight, high strength and high corrosion resistance. Lately, however, in addition to research and development by the above two leading civilian aircraft manufacturers, the rise of the price of crude oil and its duration have made it imperative to examine ways of reducing the airframe weight.

The automotive industry as well, in order to cope with the rise of crude oil prices and environmental issues, is promoting the development of hybrid vehicles, electric cars and, in Europe, high-performance diesel engine vehicles. Moreover, it is expected that fuel cell vehicles, which have the highest energy conversion efficiency, will someday see widespread use. Although significant advances have been made in the development of fuel cells, the largest and most difficult problem that remains for use in automobiles is how to safely and smoothly handle hydrogen fuel, for which laborious work has been made. While safety is most important in civilian use, the obstacles are too large to make it a routine matter for general users to deal with cars loaded with hydrogen gas under several hundred atmospheres of pressure. Hence, the current liquid fuel system is not likely to change for the time being. In this sense, reducing the weight of vehicle construction is important for achieving real improvements in the power system. In fact, aluminum alloy materials are being applied increasingly in some types of vehicles and it is predicted that use of CFRP will be required someday.

In aircraft manufacture, the increased utilization of CFRP materials entails an increase in material expenses due to the high-cost CFRP materials, in addition to which it presents technical problems. One such problems is that, even in the latest Airbus and Boeing aircraft for which mass production has already been decided, it is estimated that the utilization of aluminum alloys will top 50% in terms of weight, with both CFRP materials and A7075 materials being used. CFRP materials will be used in areas close to the wing tips and A7075 materials will be used, as in the past, in central structure areas of the fuselage. Joining of the two materials will generally be done with rivets or with bolts and nuts, while special products will be required for this purpose.

This is because of the large differences between CFRP materials and metals in their basic properties. Metal materials have a large elongation (elongation at break), that of A7075 being 10 to 16%, whereas CFRP has an elongation of only several percent. When a strong tensile force is applied to these materials, the metal material undergoes elastic stretch (in accordance with Young's modulus, elongation and contraction that is proportional to the force) up to a certain strength; when a force that exceeds this limit is applied, elongation in excess of Young's modulus takes place, where break occurs at 110 to 116% of the original length (100%) for A7075. On the other hand, for CFRP, when pulled in a direction parallel to the fibers, elongation of the carbon fibers themselves is only 1 to 2%. When a large tensile load is applied that exceeds the range of elongation and contraction in accordance with Young's modulus, the carbon fibers break and the CFRP tears. In other words, CFRP has a small range in the ability of the material to absorb forces by undergoing elongation itself.

The same is true not only for tensile forces but also for crushing forces (compressive forces). That is, when tightened with bolts and nuts, even if the compressive forces exceed a certain limit, a metal will be deformed itself, enabling break to be avoided. However, when a compressive load is applied to CFRP, the force is first supported by the cured epoxy resin; with the application of an excessive pressing force, the epoxy resin is forced to spread peripherally and be deformed but spreading is limited by the carbon fibers, as a result of which the resin does not move and thus cannot be deformed, leading ultimately to failure.

In short, when a throughhole is formed in CFRP, a bolt is inserted into the hole and a nut threaded on the bolt is used to tighten the CFRP with an excessive torque, the CFRP undergoes compressive break. Because the large differences between the physical properties of both materials are due to inherent differences between a metal part, which is composed of metallic bonds between atoms, and epoxy resins and carbon fibers, which are composed of covalent bonds between carbon atoms and the like, there are basically no means for improving the properties themselves. Therefore, when both are tightened and secured with bolts and nuts, the only solution is to avoid applying excess pressure so as to prevent break on the CFRP side. This requires the development and use of special bolts and nuts. It has even been reported that the success by a certain corporation in developing such a bolt structure helped to spur the competition today in development of civilian aircrafts.

In future aircrafts, regardless of the degree to which the utilization of CFRP increases, the utilization of light metal materials will never go to zero, which means that techniques for easily joining CFRP materials with aluminum alloy materials will continue to be very important basic technology. There is another problem as to releasing of the CFRP prepreg from the metallic mold after its heat-curing. The prepreg undergoes heat-curing in a pressurized state under compressive forces applied by the metallic mold. In this operation, because the epoxy resin functions as an adhesive with respect to the mold as well, it is necessary to apply a release agent between the mold and the prepreg. As a result, infiltration of the release agent (generally a silicone oil-type release agent) into the CFRP product is unavoidable, which makes it impossible to achieve the highest physical properties inherent to the epoxy resin. Even minor decreases in quality are issues that must be resolved for use in structures for high-speed moving machinery such as aircrafts and automobiles. The present invention was conceived in order to provide a solution to such problems.

The inventors have made inventions as to techniques for securely joining a plastic part formed by injection molding with a metal part that has been inserted beforehand into the metallic mold for injection, specifically, aluminum alloy parts, magnesium alloy parts, copper alloy parts, titanium alloy parts, stainless steel parts, etc. (which techniques are referred to below as "injection joining" techniques) (see Patent Document 1: WO 03/064150 A1, Patent Document 2: WO 2004/041532 A1, Patent Document 4: Japanese Patent Application No. 2006-329410, Patent Document 5: Japanese Patent Application No. 2006-281961, Patent Document 6: Japanese Patent Application No. 2006-345273) and Patent Document 6: Japanese Patent Application No. 2006-354636).

A major factor was the discovery of surface treatment methods carried out beforehand on the metal to be inserted. The inventors anticipated that the surface shape of the metal obtained by such surface treatment would have a desirable effect not only on injection joining but also on joining (adhesion) with ordinary adhesives.

In the above-described inventions as to "injection joining", the surface state desired in the metal alloy to be used can be summarized in terms of the following conditions (1) to (3). The first of these conditions (1) is that the rough surface obtained by chemical etching have irregularities (depressions and protrusions) with a period of 1 to 10 µm, with the height difference between the depressions and protrusions being about one-half of the period, i.e., 0.5 to 5 µm. The reason for this is that, when the molten resin flows into the metallic mold having a temperature well over a hundred and several decade degrees Centigrade lower than the melting point of the resin under a high pressure of several hundred to a thousand atmospheres, the diameter of the depressions into which the resin can somehow manage to penetrate as it crystallizes and hardens is 1 to 10 µm.

However, it is actually difficult that cover 100% of an aluminum alloy surface in this way with such a rough surface, given the variability of chemical reactions. It is practically regarded that such a surface roughness satisfies the above-mentioned roughness conditions, for which a curve indicating depressions and protrusions with an irregular period ranging from 0.2 to 20 µm and having a maximum height difference in a range of 0.2 to 10 µm as measured with a surface roughness tester can be traced, or for which a mean peak spacing (RSm) is 0.8 to 10 µm and a maximum height (Rz) is 0.2 to 10 µm analyzed with a scanning probe microscope, where such amounts as RSm and Rz are defined in the JIS standard (JIS B 0601:2001). The inventors, having recognized and concluded that the period of the depressions and protrusions on an ideal rough surface is, as noted above, 1 to 10 µm, refer in the present invention to a rough surface with a surface roughness defined in this way as a "surface with micron-order roughness," which is a readily understood technical term.

The second condition (2) is that, when the rough surface is viewed with a magnification of an electron microscopic level, it has a finely irregular surface of depressions and protrusions with a period of 10 to 500 nm, most preferably a finely irregular surface with a period of 40 to 50 nm. The third condition (3) is that the surface is covered with a thin layer of metal oxide which is either thicker or stronger than an ordinary natural oxide layer for that particular metal alloy. Each of these three conditions required on the metal alloy side were attained, as noted above, for all of the following: magnesium alloys, titanium alloys, copper alloys, stainless steel alloys, aluminum alloys, etc., as a result of which it was possible to achieve a high shear breaking strength between the metal and the cured resin of at least 20 to 30 MPa with injection joining. This clearly proved the correctness of the hypothesis that the above three conditions are essential for injection joining. At this point, the inventors expected that this hypothesis should obviously have desirable effects also in joining (adhesion) with adhesives.

Hence, the inventors proposed the following hypothesis concerning adhesive joining. First, the metal alloy piece with a surface which satisfies the three above mentioned conditions is prepared in the same way as that used in the above described injection joining experiment and a liquid, one-pack epoxy adhesive is applied to the metal piece. Next, the metal piece is subjected to such steps as being placed in a vacuum state and then returned to standard pressure, causing the adhesive to infiltrate and smoothly coat the finely textured face of the metal alloy surface. The adhesive is then cured through heating. It was thought that, in this way, the liquid epoxy adhesive would be able to enter into the depressions of the micron-order roughness of condition (1) for the metal alloy surface at an inflow pressure of only about one atmosphere. If such penetration is possible, the epoxy adhesive will be cured within these valleys with subsequent heating.

In this case, the inner walls of these depressions have the nanometer-level finely irregular surface of condition (2). Complete penetration of the epoxy adhesive to the depths of the fine depressions formed in the finely irregular surface of (2) is presumed to be difficult. However, some of the epoxy adhesive does extend inside the openings of the fine depressions and is cured. In such a case, the epoxy adhesive that has been cured inside a large depression achieves the state of being secured (engaged) at the interior of the depression by innumerable spikes, which should make it difficult to be peeled away from the metal substrate by an external force. When the cured epoxy resin is forcibly peeled away, because the metal oxide layer of above-described condition (3) for the surface in contact with the spikes has a sufficient thickness to exhibit the hardness of this ceramic material, deformation on the metal alloy side is limited, making it impossible to pull out the epoxy resin within the large depression. Ultimately, the epoxy resin itself breaks near the opening of the large depression. In such cases, the force required for break far exceeds the adhesive strength data for hitherto known adhesives.

The correctness of this hypothesis has, in fact, already been proven, first for aluminum alloys, then for magnesium alloys, copper alloys, titanium alloys and stainless steel alloys. Subsequent to the present invention, the inventors are occupied in verification tests and plan to propose a group of inventions concerning various metal alloys. Based on these tests, the inventors believe that the above hypothesis concerning adhesive joining is correct, while it will accept the approval or criticism from many scientists and chemists. In the present invention, the inventors refer to this hypothesis as "NAT (Nano Adhesion Technology)". With NAT, as explained above in regards to adhesion with an adhesive, joining can be understood as an entirely physical effect, that is, as an anchoring effect. Without such an understanding, it is impossible to explain the immense joining strengths of 500 to 700 kgf/cm$^2$ (50 to 70 N/mm$^2$=50 to 70 MPa), measured as the shear strength at break and the tensile strength at break, which are exhibited with the use of an epoxy-based adhesive, not only for aluminum alloys but also for other metal alloys as well.

In addition, it has been mentioned above as condition (1) that large depressions and protrusions, that is, depressions and protrusions with a period of 1 to 10 μm, are desirable, while this NAT applies not only to the aluminum alloys shown in the present invention but it has been demonstrated also, for example, for copper alloys, titanium alloys, stainless steel alloys and common steel materials. In cases where depressions and protrusions larger than described above are present and, conversely, in cases where depressions and protrusions that are too much smaller than described above are present, the joining strength due to joining with an adhesive became lower. For depressions that are too large, the most likely reason is such that the density of depressions that forms per unit surface area becomes low, thus reducing the anchoring effect. For depressions that are too small, penetration of the epoxy adhesive into the interior is probably insufficient.

By utilizing the above-described joining strength according to NAT, it is possible to achieve the many needs mentioned in the preceding section. First, in the case of adhesive joining between metal alloys for which surface treatment according to NAT hypothesis was made, a very strong adhesive force can be obtained between metal alloys by using an epoxy adhesive. This is the case both in joining between aluminum alloys and in joining between an aluminum alloy and a titanium alloy. The reason is that the joining strength itself does not arise between the metals but it rather arises between the respective metals and the epoxy resin. Also, a fiber-reinforced plastic (FRP) material in which the epoxy resin is used as the matrix is, not surprisingly, the most trouble-free mating material for adhesive joining with a metal alloy piece. It can be appreciated that, by pressing together a FRP prepreg and an aluminum alloy part that has been coated with an epoxy adhesive, raising the temperature and simultaneously curing the epoxy resins on both sides, joining (anchoring) will be easier than between metals.

One conceivable form of this adhesion is a structure in which the FRP material is sandwiched between thin sheets of aluminum alloy, that is, a laminated structure. Although there is an increase in weight, degradation of the epoxy resin by a release agent can be prevented, because a mold release agent for the prepreg is not necessary. Also, in cases where a sandwich structure is formed in which part of the prepreg rather than the entire surface is placed between thick sheets of aluminum alloy to form a sandwich structure, throughholes are formed in the structure, bolts are passed through the holes and joining to another part is carried out, break of the CFRP portion can be avoided even when the bolts are over-tightened.

Additionally, in a plate-like or tubular structural member formed integrally of an aluminum alloy member at the ends and a CFRP member as the main material at the center, connection with bolts and nuts, fitting or some other known metal joining method may be employed by utilizing the ends thereof, facilitating assembly and disassembly, thus giving a member compatible with large-volume production. This should be helpful in reducing weight and increasing strength not only in aircrafts but also in vehicles such as automobiles, in mobile electronic and electrical equipments, in robot machineries or the like. Today, CFRP materials are very familiar materials. The ability to employ such materials in vehicle applications will enable major contributions to be made to the energy-saving and environmentally responsible society in the future.

SUMMARY OF THE INVENTION

The present invention, which was conceived in order to solve the problems described above, achieves the following objects.

One object of the present invention is to joining an aluminum alloy composite obtained by joining a CFRP material with an aluminum alloy and a method for manufacturing such a composite.

A further object of the present invention is to provide an aluminum alloy composite and a method for manufacturing the same, which enable a CFRP material and an aluminum alloy part to be joined without using a fastening means such as a bolt and nut having a special construction, that is, which enables such joining to be carried out with ordinary fastening means.

A still further object of the invention is to provide an aluminum alloy composite and a method for manufacturing the same, which do not require a release agent when a CFRP material and an aluminum alloy are joined (anchored).

The invention employs the following means to achieve the above objects.

The aluminum alloy composite of the present invention is composed essentially of a first metal part made of a first aluminum alloy having a micron-order surface roughness formed by chemical etching on a surface thereof, the surface having thereon a thin layer of aluminum oxide with a thickness of at least 2 nm that is free of sodium ions and the surface roughness having formed therein an ultra-fine irregular surface formed of depressions or projections having 10 to 100 nm diameter and substantially equal depth or height; and an adherent part joined to the first metal part with an epoxy-based adhesive that has penetrated into the ultrafine irregular surface.

The method for manufacturing an aluminum alloy composite of the present invention is composed essentially of a step of shaping an aluminum alloy part by mechanical working from a casting or an intermediate material; a chemical etching step by immersing said shaped aluminum alloy part in a strongly basic aqueous solution; a neutralizing step by immersing said aluminum alloy part in an aqueous solution of an acid after the chemical etching step; an ultrafine etching step by immersing the aluminum alloy part in an aqueous solution containing at least one selected from among hydrazine hydrate, ammonia and water-soluble amine compounds so as to form on the part an ultrafine irregular surface after the neutralizing step; a step of coating said ultrafine irregular surface of the aluminum alloy part with an epoxy adhesive; a step of forming a fiber-reinforced plastic prepreg material containing epoxy resin component into a required shape; a step of attaching the shaped prepreg material to the epoxy adhesive-coated surface of the aluminum alloy part; and a step of positioning said prepreg material and the aluminum alloy part and curing the epoxy-based adhesive and the epoxy resin component through applying heat and pressure.

BRIEF DESCRIPTION OF THE DRAWINGS

FIG. 6 is an electron micrograph of a piece of A7075 aluminum alloy that was etched in an aqueous solution of caustic soda and then neutralized in an aqueous solution of nitric acid.

FIG. 7 is an electron micrograph of a piece of A7075 aluminum alloy that was etched with an aqueous solution of caustic soda, neutralized with an aqueous solution of nitric acid and then etched in an aqueous solution of hydrazine hydrate as an ultrafine etching.

FIG. 8 is an electron micrograph of a piece of A7075 aluminum alloy that was etched with an aqueous solution of caustic soda, neutralized with an aqueous solution of nitric acid, then etched in an aqueous solution of hydrazine hydrate as an ultrafine etching and subsequently treated with aqueous hydrogen peroxide.

FIG. 9 is an electron micrograph of a piece of A5052 aluminum alloy that was etched with an aqueous solution of caustic soda, neutralized with an aqueous solution of nitric acid and then subjected to ultrafine etching treatment for 1 minute in an aqueous solution of hydrazine hydrate having a concentration of 3.5%.

FIG. 10 is an electron micrograph of a piece of A5052 aluminum alloy that was etched with an aqueous solution of caustic soda, neutralized with an aqueous solution of nitric acid and then subjected to ultrafine etching treatment for 2 minutes in an aqueous solution of hydrazine hydrate having a concentration of 3.5%.

FIG. 11 is an electron micrograph of a piece of A5052 aluminum alloy that was etched with an aqueous solution of caustic soda, neutralized with an aqueous solution of nitric acid and then subjected to ultrafine etching treatment for 4 minutes in an aqueous solution of hydrazine hydrate having a concentration of 3.5%.

FIG. 12 is an electron micrograph of a piece of A5052 aluminum alloy that was etched with an aqueous solution of caustic soda, neutralized with an aqueous solution of nitric acid and then subjected to ultrafine etching treatment for 8 minutes in an aqueous solution of hydrazine hydrate having a concentration of 3.5%.

DETAILED DESCRIPTION OF THE PREFERRED EMBODIMENTS

Figure 1:
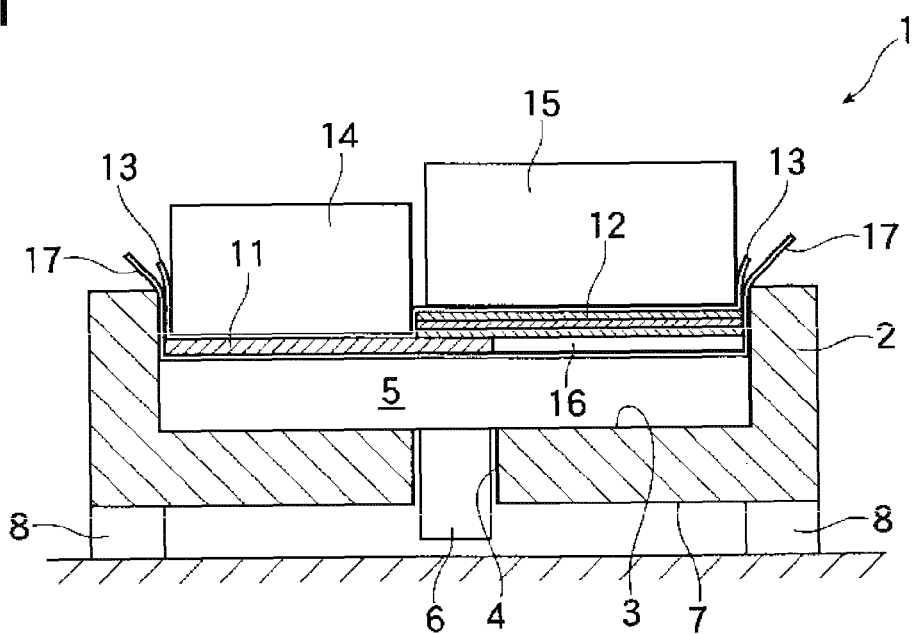
FIG. 1 is a schematic view showing a firing jig for curing an aluminum alloy piece and a CFRP prepreg within a hot-air dryer and a method of setting up the same.

The constituent features of these inventions will be described respectively below in detail.
[Aluminum Alloy Part]
The aluminum alloy used in the present invention may be of any type, so long as it is an aluminum alloy. For example, all malleable aluminum alloys, such as those defined in Japanese Industrial Standard (JIS) A1000 series to 7000 series (e.g., corrosion-resistant aluminum alloys, high-strength aluminum alloys, heat-resistant aluminum alloys, etc.) and aluminum alloys for casting, such as JIS ADC 1 to 12 (aluminum alloys for die casting), may be used. In the case of casting alloys, shaped forms that may be used include parts that have been shaped by dye casting or such parts that have additionally been shaped by mechanical working. In the case of malleable alloys, a plate stock or the like as an intermediate material and a part, which has been shaped from the same by mechanical working such as hot pressing, may be used.
[Surface Treatment, Pre-Treatment of Aluminum Alloy Parts: Theories and Basic Thought Thereof]

It is preferable to immerse the aluminum alloy part at first in a degreasing tank and remove any fats, oils and oil-based agents that have adhered to the part in mechanical working. A special degreasing treatment is not required in the present invention. Rather, it is desirable to prepare a warm aqueous solution by adding a commercially available degreasing agent for aluminum alloys to hot water in the concentration specified by the chemical manufacturer and rinse the aluminum alloy part by immersing it in the solution. That is, degreasing treatment by a method commonly used on aluminum alloys will suffice. Although there will be some variation depending on the particular degreaser product, with an ordinary commercially available product, immersion is carried out for a period of 5 to 10 minutes at a concentration of 5 to 10% and at a solution temperature of 50 to 80° C.

In subsequent pretreatment steps, the treatment method will differ according to whether the aluminum alloy includes a relatively large amount of silicon or has only a low level of such ingredients. In the case of alloys having a low silicon content, i.e., malleable aluminum alloys such as A1050, A1100, A2014, A2024, A3003, A5052 and A7075, a treatment method like the following is preferred. That is, it is desirable for promoting good reproducibility of the subsequent alkali etching step to immerse the aluminum alloy part in an acidic aqueous solution for a short time and then to rinse with water, thus allowing the acid ingredient to be adsorbed onto the surface layer of the aluminum alloy part. This treatment, which could be referred to as a preliminary pickling step, may be carried out using a dilute aqueous solution of an inexpensive mineral acid such as nitric acid, hydrochloric acid or sulfuric acid at a concentration of one to several percent. Next, etching is carried out by immersing the aluminum alloy part in a strongly basic aqueous solution and rinsing with water.

Such etching strips away fats, oils and scum remaining on the surface of the aluminum alloy along with the surface layer of the aluminum alloy. Simultaneously with such stripping, the surface comes to have a micron-level roughness, i.e., a mean peak spacing (RSm) of 0.8 to 10 μm and a maximum height (Rz) of 0.2 to 5.0 μm in terms of the JIS standards (JIS B 0601: 2001; ISO 4287: 1997; ISO 1302: 2002). When examined with a scanning probe microscope of the type in use today, these numerical values are automatically calculated and output of them is given. However, there are cases where, when numerical values are displayed for the fine surface irregularities by automated output, the calculated RSm values do not represent the actual state. For better results, it is necessary to visually reconfirm the RSm values on a roughness curve graph that can be generated as output by the scanning probe microscope and represent this irregular surface state.

If, on visual inspection of the roughness curve graph, the roughness state is one where the height difference falls in a range of 0.2 to 5 μm at irregular periods within a range of 0.2 to 20 μm, the actual state is substantially the same as that mentioned above. Such visual inspection method is advantageous because, in cases where automatic calculations are judged to be unreliable, a determination can easily be made by visual inspection. To summarize, using the technical term defined herein, the surface of the aluminum alloy part is formed to be "a surface with micron-order roughness." The solution used is preferably an aqueous solution of caustic soda at a concentration of one to several percent, with immersion being carried out for several minutes at preferably 30 to 40° C. Next, it is preferable to complete pretreatment by again immersing the aluminum alloy part in an acidic aqueous solution, then rinsing with water to remove sodium ions. The inventors refer to this as the neutralization step. It is especially preferable for this acidic aqueous solution to be an aqueous solution of nitric acid having a concentration of several percent.

In the case of aluminum alloys for casting, such as ADC 10 and ADC 12, it is preferable for the procedure to include the following steps. That is, following the degreasing step in which oils and fats are removed from the surface of the aluminum alloy, it is desirable to carry out preliminary pickling and etching in the same way as in the above-described step. As a result of such etching, copper components or silicon components which do not dissolve under strongly basic conditions become fine-grained black smut (because such contaminants are referred to in the plating industry as smut, this usage is followed here as well). It is thus desirable to dissolve and strip away this smut, then immerse the aluminum alloy part in an aqueous solution of nitric acid having a concentration of several percent. With immersion in an aqueous solution of nitric acid, the copper smut is dissolved and the silicon smut rises off the aluminum alloy surface.

In the case where the alloy used is one having a large amount of silicon components, such as ADC 12, if the alloy is only immersed in an aqueous solution of nitric acid, silicon smut will continue to adhere to the surface of the aluminum alloy substrate and will not be completely stripped away. Therefore, it is preferable to carry out ultrasonic cleaning in which the part is immersed in a water tank and ultrasonic vibration is given to the water, thereby physically stripping off the silicon smut. While this does not remove all the smut, it is sufficient for practical purposes. Pretreatment may be brought to an end at this point, although it is preferable to once again immerse the part in a dilute aqueous solution of nitric acid for a short time and rinse it with water. This completes pretreatment. Because pretreatment ends with immersion in an acidic aqueous solution and rinsing with water, no sodium ions remain. The sodium ions are explained below.

Based on experimental findings, the joining strength which is given when two pieces of aluminum alloy are joined with each other using an epoxy adhesive is determined substantially by the micron-order roughness and the nanometer-order, ultrafine irregular shape characteristics of the surfaces with depressions and protrusions. The experimental findings show that, by searching for the immersion conditions, etc. when etching is carried out with an aqueous solution of caustic soda, if such conditions mentioned above that the NAT hypothesis are satisfied in respect of surface configuration, even if it be occasional, a surprisingly strong adhesive strength can be obtained. However, once surface treatment has been finished in case of treatment that involves only etching with caustic soda, sodium ions will remain in the aluminum alloy surface layer even with more than adequate water rinsing thereafter. Because sodium ions have a small particle size, they migrate easily. Even after painting or joining has been carried out, in a wet state of the overall assembly, sodium ions which have remained present are entrained by water molecules passing through the resin layer and are collected at the metal/resin interfacial surface for some reason, where they promote oxidation of the aluminum surface.

That is, corrosion of the aluminum alloy surface occurs, as a result of which separation between the substrate and the paint film or adhesive is promoted. Given such circumstances, there is as yet no reason to carry out etching in an aqueous caustic soda solution as an aluminum alloy pretreatment prior to joining. Accordingly, even today, the standard pretreatment method for strong adhesive joining is regarded to be chromate treatment, in which the aluminum alloy is immersed in an aqueous hexavalent chromium compound solution of potassium bichromate and chromium trioxide, or anodization and use in an unsealed state. In short, prior to pay attention to enhancing the adhesive strength by etching, primary aim was taken at prevention of corrosion and degradation of the aluminum alloy surface.

However, the etching of aluminum alloys with caustic sodium has not been abandoned altogether and is still commonly used in pretreatment for painting. Generally, an extreme adhesive strength is not required in painting, for it is thought that, other than in outdoor use applications where the product is placed in the weather, immersion in water will not occur. Moreover, unless the product is of a type where, for example, the paint film is to be guaranteed for ten years, such painting pretreatment is not unreasonable. Without being based on such easy-going reasoning, the main subject of the present invention is to achieve a long-term joining stability. To this end, the most important issue is to get rid of sodium ions.

Sodium in Aluminum Alloy

The sodium (Na) present in the aluminum alloy will be also discussed. In the aluminum metal manufacturing process, bauxite is dissolved in an aqueous solution of caustic soda to give a high-purity aluminum compound, which is then electrolytically reduced to yield aluminum metal. In this manufacturing process, the presence of sodium as an impurity in the aluminum metal is unavoidable. However, in current metallurgical technology, it is possible to suppress the sodium content in aluminum alloys to an extreme degree. Therefore, in an ordinary environment in which there is no acid-base mist, corrosion does not advance in commercially available aluminum alloys today when direct wetting (liquid water) is not present. Corrosion actually proceeds at a high rate when there is wetting, salt (sodium chloride) from sea winds and heating with sunlight. That is, when commercially available aluminum alloys are used outdoors in coarse environments, such as in towns and cities located near the seashore where sea winds are strong and the atmospheric temperature is high, the rate of corrosion is high.

The solution to avoid such corrosion is generally to coat the entire surface with paint, adhesive or the like. When this is done, it is essential that cracks or fissures are not formed in the paint film or adhesive layer and further it is important to keep salt-containing water from entering such cracks and fissures and penetrating to the surface of the aluminum alloy. When such measures are taken, it is not always necessary for surface treatment of the aluminum alloy to entail common chromate treatment. As long as the paint film has a good weather resistance and adhesion between the paint film and the substrate is good, even in an adverse environment, the aluminum alloy will be durable long enough with painting alone. In particular, with the use of hexavalent chromium currently being in the course of worldwide rejection, chromate treatment can no longer be regarded as a desirable method for surface treatment of aluminum alloys. Today, many paints with excellent durability and adhesives having outstanding moisture and heat resistance are commercially available. In light of the above, the inventors have attempted to optimize the conditions to be sought on the aluminum alloy side, in order to maintain a strong joining between paint or adhesive and the aluminum alloy substrate for a long time and to arrive at a theoretical understanding of such conditions.

Surface of the Aluminum Alloy

Figure 5:
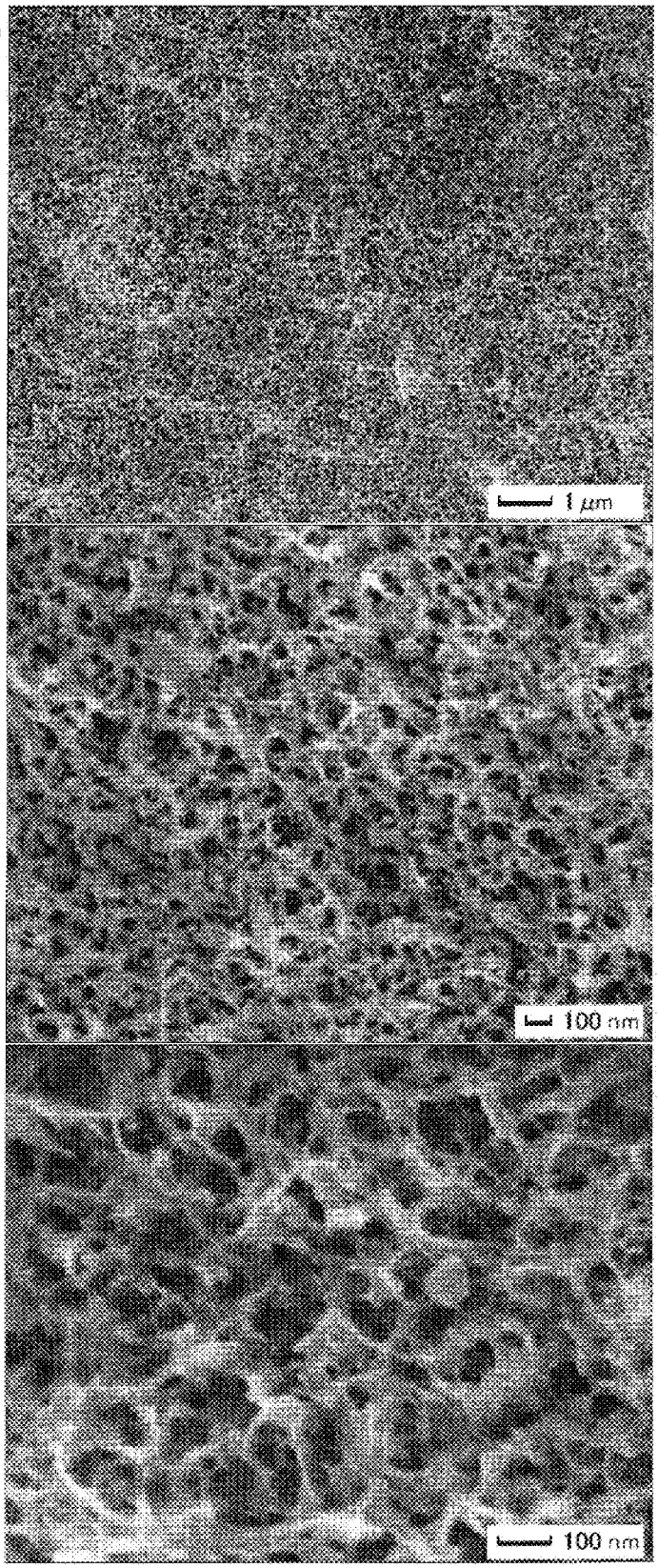
FIG. 5 is an electron micrograph of a piece of A7075 aluminum alloy that was etched with an aqueous solution of caustic soda.

The desired degree of roughness for the aluminum alloy surface is obtained primarily with a strongly basic aqueous solution such as a caustic soda solution, followed by immersion in an aqueous solution of acid and thorough rinsing with water to remove sodium ions. However, under observation with an electron microscope, the microstructure of the surface obtained by etching with an aqueous solution of caustic soda (FIG. 5 shows an example of such a surface on A7075) has very fine depressions and protrusions with a periodicity of several tens of nanometers. Such a surface should make a cured adhesive difficult to be removed from depressions in the substrate; indeed, a finely irregular surface such as this is sought after and desirable according to the NAT hypothesis. Yet, on the surface obtained by immersing this aluminum alloy in an aqueous solution of nitric acid and rinsing with water (FIG. 6 shows an example of such a surface on A7075), the quality required for the fine depressions and protrusions was degraded. In short, the operation of immersing the aluminum alloy in an acidic aqueous solution to remove sodium ions amounted to a type of chemical polishing. The surface, as viewed in an electron micrograph, forms what might be expressed in sensory terms as a textured surface. The degree of texture on this textured surface is lowered by chemical polishing, which has an opposite effect on adhesive joining.

Accordingly, the approach taken was to restore this degree of texture by the main treatment described below. Micrographs for reference are shown in FIGS. 5 to 7, with FIG. 6 being an example of an electron micrograph taken after immersion treatment in an aqueous solution of nitric acid. The reasons explained above will be appreciated from these images. It should be noted that the experiences, thought and theories by the inventors which ultimately led to the present invention are also a product of the ability to make ready use of high-performance electron microscopes capable of achieving a high resolution of several nanometers. Also, the thought in the present invention was to achieve durability and corrosion resistance of the aluminum alloy by having the final aluminum alloy surface be surface layer of aluminum oxide and by raising the joining strength of the adhesive to the alloy substrate to the utmost.

[Surface Treatment, Main Treatment and Ultrafine Etching of the Aluminum Alloy Part]

The aluminum alloy part on which pretreatment has been completed is then subjected to the following type of surface treatment as the final treatment, i.e., main treatment. Following the completion of pretreatment, the aluminum alloy part is immersed in an aqueous solution containing at least one from among hydrazine hydrate, ammonia and a water-soluble amine compound, after which it is preferably rinsed with water and dried at 70° C. or below. This is also intended to restore a rough surface after the surface was somewhat altered by the sodium ion-removing treatment carried out as the final step in pretreatment (so that it became smoother while retaining a degree of roughness). The aluminum alloy part is immersed for a short time in a weakly basic aqueous solution, such as an aqueous solution of hydrazine hydrate, thereby making ultrafine etching carried out, causing the surface to be covered with a ultrafine irregular surface having depressions or protrusions of 10 to 100 nm diameter and equal height or depth. More precisely, it is desirable to form numerous fine irregularities having a period of 40 to 50 nm over the inner walls of the depressions in the micron-order irregularities so as to finish the surface to a high degree of what might be referred to as texture when viewed on an electron micrograph.

Also, by making the drying temperature after rinsing elevated to at least 100° C., if the interior of the dryer is hermetically sealed, hydroxylation reactions between boiling water and aluminum arise, altering the surface and forming a boehmite layer. This can hardly be called a tough surface layer and is thus undesirable. The moisture conditions within the dryer are determined not only by the size of the dryer and the manner of air circulation but also by the amount of aluminum alloy loaded therein. In this sense, regardless of the loading conditions, hot-air drying at 90° C. or lower, preferably at 70° C. or lower, is desirable for achieving good results having a good reproducibility to prevent the formation of boehmite at the surface. When drying is carried out at below 70° C., only trivalent aluminum can be detected from the aluminum peaks in surface elemental analysis by XPS; the zero-valent aluminum which can be detected in XPS analysis in commercially available A5052 and A7075 aluminum alloy plate stock and the like vanishes.

Because XPS analysis allows elements present from the metal surface to a depth of 1 to 2 nm to be detected, these results show that immersion in an aqueous solution of hydrazine hydrate or an amine compound followed by rinsing with water and hot-air drying have the effect of making the natural oxide layer (a thin aluminum oxide layer having a thickness of about 1 nm) initially present on the aluminum alloy even thicker through the main treatment. It was found that, unlike the natural oxide layer, the layer has a thickness of at least 2 nm, so further study was not performed. That is, although analysis at deeper positions of from about 10 to 100 nm is possible by carrying out XPS analysis after etching with an argon ion beam or the like, it was concluded that such analysis would be difficult at the present time, because there is a possibility that the valence number of aluminum atoms in deeper layers will change due to the influence of the beam itself. As a result, the inventors suspended such inquiry.

The formation of an aluminum oxide layer on the aluminum alloy surface by other surface treatment methods will be discussed. One surface treatment method carried out to improve the durability of aluminum alloy is anodization. When anodization has been carried out on an aluminum alloy, an aluminum oxide layer having a thickness of from several microns ($\mu m$) to somewhat over ten microns ($\mu m$) can be formed, greatly enhancing durability. Innumerable openings in pits having a diameter of about 20 to 40 nm remain on the aluminum oxide layer immediately after anodizing treatment. If adhesive joining or paint application is carried out in this state, that is, in an unsealed alumite state, the adhesive or paint will enter somewhat through the openings into the pits and be cured, apparently exhibiting a strong anchoring effect and giving rise to a high joining strength in joining with an adhesive. As a matter of fact, the joining of a dissimilar material with such an anodized aluminum alloy by coating the aluminum alloy with an adhesive is known in aircraft assembly.

However, the inventors have doubts about this. That is, when shear breaking tests were carried out on a united object obtained by strongly joining together two pieces of anodized aluminum alloy using an epoxy adhesive, no sample broke with forces in excess of 40 MPa (40 N/mm$^2$), according to the breaking tests by the inventors. Moreover, on examining the faces of fracture, it was not the adhesive that broke but rather, in most cases, the anodized layer (aluminum oxide layer) was separated from the aluminum alloy substrate. The inventors concluded from this that, "the surface of the metal side required for strong joining must be a ceramic-type high-hardness layer such as a metal oxide, while it must not be too thick." Although the anodic oxide surface layer is aluminum oxide, which is an oxide of the substrate aluminum itself, the surface layer is a ceramic and the substrate is a metal, so the types of material are different each other.

If the ceramic material is thick, differences in the physical properties will necessarily emerge in an extreme state, as a result of which the material is likely to break. For this reason, it is preferable for the metal oxide layer to be thin. Also, it is generally understood that if the metal oxide is a ceramic in an amorphous or microcrystalline state, it should be joined firmly with the substrate. That is, it was concluded that, in order to bring the shear breaking strength and tensile breaking strength of the adhesive to a very high level of 50 to 100 MPa, the metal oxide layer should not be made so thick and that using unsealed alumite which has been anodized is undesirable.

Ultrafine Etching

What is referred to as ultrafine etching in the present invention will be now described in further details. Upon immersion of the aluminum alloy in a weakly basic aqueous solution having a pH of 9 to 10, e.g., hydrazine hydrate, ammonia or a water-soluble amine, at a suitable temperature and for a suitable length of time, the entire surface becomes covered with ultrafine irregular shapes with depressions and protrusions having a diameter of 10 to 100 nm. Expressed as a number-average diameter, this is about 50 nm. Stated differently, this means that it is desirable to select a pH, temperature and time which are optimal for obtaining ultrafine topographically irregular shapes having a diameter of 10 to 100 nm on the surface. Based on experience, the inventors predict that the ultrafine irregularities with depressions and protrusions have a period or a diameter, which is most preferably about 50 nm. The reason is that, in the case of irregularities having a period of 10 nm, rather than being a textured surface, the manner of irregularity is too fine, resulting in a surface that is smooth for an adhesive. On the other hand, a period of more than 100 nm appears to exceed the bounds of what would normally be construed as a textured surface, so that there is little inclination to anchoring. In the present invention, "number average" does not refer to a mean of summation of a degree that enables statistical validation but, rather, it refers to an average value obtained for 20 or fewer samples.

The value of 50 nm was obtained at empirically based on experimental results. However, even when aiming at a period of 50 nm, a perfectly ordered arrangement cannot be obtained with chemical reactions, so some variability is to be expected. There is no alternative but to examine photographs taken with an electron microscope and convert the resultant into numerical values. The result corresponds to a surface of ultrafine irregular shapes that are substantially entirely (100%) covered with 10 to 100 nm diameter depressions and protrusions of the same depth or height. In fact, when most of the surface was occupied by depressions or protrusions having a diameter of 10 to 20 nm, or, conversely, by depressions and protrusions having a diameter of 100 nm or more, the joining strength was inferior. Actual cases, in which A7075 material or A5052 material was etched with an aqueous solution of hydrazine hydrate, will be described below in the following experimental examples.

Experimental Examples of Ultrafine Etching

In order to be able to cover an aluminum alloy with depressions and protrusions of such a size, it is necessary to search for the immersion conditions by trial and error. When a 60° C. aqueous solution containing a hydrazine monohydrate concentration of 3.5% is used to immerse A5052 and A7075 stock, setting the immersion time to about 2 minutes is optimal. The surface obtained from this immersion time is covered entirely with depressions having a diameter of 10 to 100 nm, the number-average diameter being 40 to 50 nm. However, when the stock is immersed for 4 minutes, the diameter of the depressions rises to 80 to 200 nm, the number-average diameter is increased suddenly to more than 100 nm and additional depressions are formed at the bottom of these pits, making the structure more complex. In addition, when the stock is immersed for 8 minutes, erosion in the form of lateral holes also proceeds, resulting in somewhat of a sponge-like shape, in addition to which deep depressions are interconnected, changing into a valley or ravine-like shape. With 16 minutes of immersion, the aluminum alloy visibly changes from the original metal color, becoming somewhat brownish, from which it is apparent that the manner in which visible light is absorbed has begun to change.

When the immersion time under the above conditions was one minute, depressions having a diameter of 10 to 40 nm were observed with electron micrographs. The number-average diameter of these depressions was 25 to 30 nm. In addition, with 0.5 minute of immersion, the depressions covering the surface had a diameter of 10 to 30 nm, the number-average diameter for these depressions being about 25 nm, which is not so different from the results for an immersion time of one minute. Electron micrographs of an aluminum alloy immersed for 0.5 minute and an aluminum alloy immersed for one minute were carefully compared, whereupon the depth of the depressions was clearly shallower in the alloy immersed for 0.5 minute than in that immersed for one minute. Thus, in A5052 and A7075 stock immersed in a weakly basic aqueous solution, erosion begins at a period of 20 to 25 nm, with depressions having a diameter of 20 nm first being formed for some unknown reason. When the depth of these depressions has been increased to about the same level as the diameter, the edges of the depressions are then eroded, the depression diameter is increased and erosion in indefinite directions at the interior of the depressions begins. When erosion has taken place in this way, the simple and robust erosion that is most suitable for adhesive joining was achieved with immersion of the A7075 or A5052 in a 3 to 5%-aqueous solution (60° C.) of hydrazine monohydrate for about 2 minutes.

A resultant obtained, for example, by use of the one-pack, high-temperature curing epoxy adhesive EP106 (available from Cemedine, Japan) having a viscosity of 40 Pa·s at a temperature of 23° C., will be described. Based on the results of the adhesion experiments shown in the working examples, in the case of an aluminum alloy stock such as A7075 that was immersed for one minute in an aqueous solution of hydrazine hydrate under the conditions mentioned above, the fine depressions had a number-average diameter of about 25 nm, which was too small and the epoxy resin appeared to have difficulty in entering into these fine depressions. The joining strength apparently reached a maximum value in cases where the immersion time was set to two minutes. When A7075, etc. was immersed for two minutes under the above-mentioned conditions, the fine depressions had a number-average diameter of about 40 nm; this epoxy resin would presumably have been able to make its way into the interior of fine depressions of at least about this size.

In short, when the inner surfaces of micron-order depressions are textured faces having irregularities with depressions and protrusions at a period of several tens of nanometers, the joining strength rises. Also, when the above-described immersion time is longer than 2 minutes, e.g., when it is extended to 4 minutes or 8 minutes, not only is the depression diameter increased but also other depressions are formed within the depressions, resulting in what could be characterized as a sponge-like shape. Thus, not only is the strength of the aluminum alloy surface layer itself weakened but also the adhesive is unable to penetrate all the way into the back of the complex holes. As a result, the number of voids at the joining interface of the joined object is increased, resulting in a joining strength that is lower than the maximum value. In short, when the above-mentioned epoxy adhesive is used for an aluminum alloy such as A7075, in addition to providing a suitable micron-order roughness, it is desirable to cover the surface with ultrafine depressions having a number-average diameter of 40 to 50 nm, in order to maximize the joining strength. It can be appreciated that the range in the optimal immersion time for creating such ultrafine depressions is very narrow. This is because the best joining results were obtained at an immersion time of about 2 minutes as mentioned above.

When the same epoxy adhesive was used on A5052 aluminum alloy, the immersion conditions during etching in an aqueous solution of caustic soda differed somewhat from those for A7075. Obviously, this is probably due to differences in the manner of erosion and in the properties of the eroded surface. Further details will be given in the subsequently described experiment examples.

Ammonia water has a lower pH than an aqueous solution of hydrazine and, when the aqueous solution is set to a temperature higher than standard temperature, evaporation of the ammonia becomes vigorous. For these reasons, such immersion treatment is carried out at a high concentration and a low temperature; even when very strong ammonia water having a concentration of about 25% is used, an immersion time of 15 to 20 minutes is required. Conversely, most water-soluble amines form aqueous solutions having a stronger basicity than aqueous solutions of hydrazine, so the period of treatment will be shorter. In mass production treatment, the stability of the operation is lost if the immersion time is too long or too short. In this sense, the use of hydrazine hydrate, which allows the optimal immersion time to be set to several minutes, appears to be suitable for practical purposes.

In all cases, there were types of alloys for which the joining strength was improved upon immersion in an aqueous solution of hydrogen peroxide of several percent concentration following immersion in an aqueous solution of hydrazine hydrate, ammonia or a water-soluble amine. The thickness of the metal oxide layer on the surface may be increased but analysis is difficult at thicknesses greater than 2 nm, making theoretical elucidation impossible.

[Epoxy Resin-Based Adhesives and their Application]

A commercially available epoxy resin for adhesives may be used as the initial material for the epoxy-based adhesive employed in the present invention. Commercially available epoxy resins for adhesives include, for example, bisphenol-type epoxy resins, glycidyl amine-type epoxy resins, polyfunctional polyphenol-type epoxy resins and alicyclic epoxy resins. Any of these types may be used in the present invention. Alternatively, use may be made of a product obtained by coupling together these epoxy resins via reaction with a polyfunctional third ingredient, such as a polyfunctional oligomer having a plurality of hydroxyl groups. It is preferable to add a polyfunctional amine compound as a curing agent to these epoxy resins for adhesives and mix those together so as to create a one-pack epoxy adhesive.

Elastomer Ingredient

Adding an elastomer ingredient or the like to the above-mentioned epoxy-based adhesive ingredients is desirable in that a cushioning medium can be obtained for the situation where the joint is subjected to temperature shock or physical shock. Also, the addition of filler ingredients to the above ingredients is advantageous for enabling the linear expansion coefficient to be matched to that of the aluminum alloy and that of the CFRP material. The elastomer ingredient is preferably included in an amount of from 0 to 30 parts by weight per 100 parts by weight of the above resin ingredients combined (epoxy resin ingredients+curing agent ingredients). Including an excessive amount of the elastomer ingredient of more than 30 parts by weight will lower the joining strength, which is undesirable. One of the elastomer ingredients is a vulcanized rubber powder having a particle size of from several microns to 15 μm. Even when the adhesive is applied, the particles with a particle size of several microns or more are somewhat too large to enter the depressions on the aluminum alloy. As a result, they remain entirely in the adhesive layer and have no influence on the anchoring areas.

As a result, this ingredient has a role of withstanding shock without a loss of joining strength. Various types of vulcanized rubber may be used, although, regardless of the type of rubber, milling to a micron-order particle size is difficult. To the extent of the investigations conducted by the inventors, perhaps owing to a lack of need, there appears to be no sign of any research and development having been actively carried out on methods for manufacturing vulcanized rubber in the form of fine particles. The inventors tried the method of cooling a natural rubber vulcanizate (an ingredient which is substantially the same as the ingredient formulated in tire rubber, excluding carbon black) with liquid nitrogen, followed by mechanical milling and classification. Unfortunately, the product costs are not within a realm that is commercially viable. Another approach was to use unvulcanized or semi-crosslinked rubber and a modified super engineering plastic or a polyolefin resin. An exemplary modified super engineering plastic is the hydroxyl-terminated polyether sulfone PES100P (available from Mitsui Chemical, Japan). That is, use may be made of end-modified thermoplastic resins of a hydroxyl-terminated polyether sulfone which have a melting point or softening point of at least 300° C.

Polyolefin resins which mix easily with epoxy resins have already been developed and may also be advantageously used. The inventors believe the durability against temperature shock to be theoretically inferior to that of powdered vulcanized rubber but this is not yet in fact well known. The evaluation techniques themselves have not been carried out to the limit in the methods by the inventors. In any case, even the admixture of such unvulcanized elastomers was found to result in a high strength to temperature shock. Examples of such polyolefin resins include maleic anhydride-modified ethylene copolymers, glycidyl methacrylate-modified ethylene copolymers, glycidyl ether-modified ethylene copolymers and ethylene alkyl acrylate copolymers.

Filler

In addition, the filler will be described. It is preferable to use an epoxy adhesive composition which additionally contains from 0 to 50 parts by weight of filler per 100 parts by weight of total resin ingredients including elastomer ingredient. Examples of fillers include reinforcing fiber-type fillers such as carbon fibers, glass fibers and aramid fibers; and powder-type fillers such as calcium carbonate, mica, glass flakes, glass balloons, magnesium carbonate, silica, talc, clay and crushed carbon fibers or aramid fibers. Carbon nanotubes may also be used as filler.

Preparation of Epoxy Adhesive

Preparation of the epoxy adhesive entails thoroughly mixing together the main epoxy resin ingredients, elastomer, filler and curing agent and also, depending on the viscosity, mixing a solvent for epoxy adhesives (which is also commercially available). In the present invention, this mixture serves as an adhesive composition (an uncured epoxy resin composition). This adhesive composition is applied to the necessary places on the aluminum alloy part obtained in the preceding step. Either manual application with a brush or application with an adhesive coating equipment may be adopted.

[Treatment Step Following Application of Epoxy Resin Adhesive]

After coating, it is preferable to place the coated piece in a vacuum vessel or a pressure vessel, reduce the pressure almost to vacuum, hold the piece in this state for several minutes and then, by introducing air, either return the pressure to standard pressure or apply a pressure of several atmospheres or several tens of atmospheres. In addition, repeated cycling with raising and lowering of pressure is also advantageous. In this way, air and gases between the coating material and the aluminum alloy are removed, facilitating penetration of the applied material into the ultrafine depressions. In actual mass production, using a pressure vessel and high-pressure air leads to increased costs, both in respect of equipment and operating expenditures, so it is economically effective to carry out one or several cycles of pressure reducing/standard pressure restoration or pressure reducing/pressurization to several atmospheres using a vacuum vessel. Using the aluminum alloy according to the present invention, a sufficiently stable joining strength can be achieved with several cycles of pressure reducing/normal pressure restoration. It is also desirable to then remove the workpiece from the vessel and let it to stand for several hours in an environment of normal temperature or at approximately 40° C. Even in cases where some solvent has been added to the epoxy adhesive composition, this will enable most of the solvent to be vaporized off.

[FRP Prepreg]

Fiber-reinforced plastics (FRP) are exemplified by glass fiber-reinforced plastics (abbreviated below as GFRP), aramid fiber-reinforced plastics (AFRP) and CFRP. In this specification, FRPs in which epoxy resin serves as the matrix are discussed, while any type of FRP may be employed in the present invention, including those using glass fibers, carbon fibers or aramid fibers, as well as those which use other reinforcing fibers. The description that follows relates specifically to CFRPs, in which the effects of the present invention are most readily apparent. On the other hand, specific description of other FRPs will be omitted.

Use of a commercially available CFRP prepreg may be done, of course. Commercially available products sold as prepregs include carbon fiber woven cloth impregnated with the above-mentioned epoxy-based adhesive and prepregs produced by creating a film-like material from the above-mentioned epoxy resin in uncured form and laminating the material with a carbon fiber woven cloth. Such techniques are known in common and any person with ordinary skill in the art, not limited only to specialized manufacturers, could easily fabricate a prepreg using a carbon fiber woven fabric and a one-pack epoxy-based adhesive. Epoxy resins commonly used for this purpose include dicyandiamide-curable epoxy resins and amine-curable epoxy resins. Such resins are designed to maintain a B stage (a nearly solid but uncured state) at normal temperature, melt in the course of temperature rise to somewhere in excess of 100° C. and be cured thereafter. In this sense, it is preferable that the epoxy-based adhesive coated onto the aluminum alloy part and the epoxy-based uncured resin (adhesive) used in the CFRP prepreg have identical curing temperature properties. However, in experiments by the inventors, a high joining strength was obtained even with a prepreg that was heat-cured without particular adjustment of these curing temperature properties. It may thus be possible to obtain even better united object by carrying out further detailed investigations.

The uncured prepreg is cut into the required shape and stacked in the required manner to prepare the prepreg portion. That is, when a plurality of sheets of a unidirectional prepreg (a prepreg composed of a cloth woven from many warp threads but very few filling threads) are stacked to form a plate-like laminate, the strength directionality of the finished laminate can be controlled, by stacking the fabric with the filaments oriented in the same direction or at differing angles. In this, there appears to be much know-how on the assembly of such prepregs. Also, it is reported that, the number of warp threads and the number of filling threads is the same in a carbon fiber plain-woven cloth and, when prepregs are stacked while changing the angle 45 degrees in each successive layer, the final CFRP laminate will have the same strength in all directions. Hence, the required number of layers and the manner of stacking are planned preliminarily, then each prepreg is cut and stacked according to the plan to complete the laminate.

[Method for Layering the Prepregs and Manufacturing the Composite]

The above FRP prepreg (plate-like laminate) is placed on the earlier described epoxy adhesive-coated aluminum alloy part. When heated in this state, the epoxy resin adhesive and the epoxy resin in the prepreg melt, following which they are cured. For strong joining, it is necessary for heating to be carried out in a state where the prepreg and the aluminum alloy part are pressed together and for air present therebetween to be expelled during melting of the resin. For example, by prefabricating a seat which matches the shape of the face of the aluminum alloy on the side opposite to the joining face thereof, laying some aluminum foil or polyethylene film down on the seat, then setting the aluminum alloy part on the foil or film, placing the prepreg on the aluminum alloy part, laying polyethylene film on top of the prepreg, placing thereon a separately fabricated member to be fixed thereto that was separately fabricated from structural stock or the like and matched to the prepreg shape of the finished product and setting a weight on top, pressing and fixing can be carried out during hot curing.

Of course, any of various methods other than gravity alone may be utilized to induce curing while pressing both sides together. In the case of a member of aircraft, the entire assembly described above is enclosed in a film bag, then overheated while lowering the pressure, thereby forcibly drawing out air from the interior when all the epoxy component has melted. Because the prepreg tightens when the air has been drawn out to a certain degree, air is subsequently supplied into the film bag, thereby inducing curing under increased pressure in this arrangement. Experiments were carried out here under the assumption that the air within the prepreg is drawn off substantially by the mechanical pressure applied during melting of the epoxy component.

Heating is carried out by placing the above overall assembly in a hot-air dryer or an autoclave. Generally it is preferable to hold the assembly at between 110 and 140° C. for several tens of minutes, thereby causing the adhesive component to melt and inducing gelation, then raise the temperature to between 150 and 170° C. and heat for another several tens of minutes to effect curing. The optimal temperature conditions vary depending on the epoxy component and the curing agent component. After curing, the assembly is allowed to be cooled, then the metallic mold is removed and the shaped object is taken out. When aluminum foil or polyethylene film are used as described above, these are peeled off to enable the object to be released from the mold.

Method of Measuring Joining Strength

Figure 2:
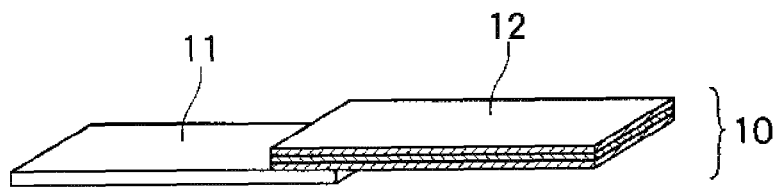
FIG. 2 shows a composite, which is also a test specimen for measuring the joining strength therebetween by applying a tensile load to break, obtained by joining an aluminum alloy sheet and a CFRP prepreg with an epoxy-based adhesive.

Measurement of the joining strength between the aluminum alloy and the FRP used in the present invention will be described below. FIG. 1 is a sectional view of a firing jig for joining the aluminum alloy and the FRP together. FIG. 2 shows a test piece of an aluminum alloy composite 10 fabricated by firing the aluminum plate and CFRP in the firing jig 1. The firing jig 1 is a holder for immobilizing the aluminum alloy plate 11 and the prepreg 12 when they are fired. The metallic mold body 2 is open at a top surface thereof and has formed therein a recessed portion 3 of rectangular shape. A mold throughhole 4 is formed at the bottom thereof.

A bottom plate projection 6 on a mold bottom plate 5 is inserted into the mold throughhole 4. The bottom plate projection 6 extends out from the mold bottom plate 5 on the mold body 2. The mold body 2 is mounted on top of a mold seat 8 with the bottom face 7 mating with the seat 8. In the situation where the mold bottom plate 5 is inserted and placed within the recessed portion 3 of the mold body 2, an aluminum alloy composite 10 composed of an aluminum alloy plate 11 joined with CFRP 12 as shown in FIG. 2 is produced through firing. Briefly, production of this aluminum alloy composite 10 is carried out by the following procedure. First, a mold release film 17 is laid down over the entire upper face of the mold bottom plate 5. An aluminum alloy plate 11 and a plate-like PTEF spacer 16 are set on top of the mold release film 17. A required prepreg 12 is placed on this PTEF spacer 16 and along with it on top of an end of the aluminum alloy plate 11. The prepreg 12 is a CFRP prepreg composed of a reinforcing fiber woven cloth impregnated with an uncured epoxy-based adhesive.

After laying down the prepreg 12, a piece of mold release polyethylene film 13 is additionally placed on both the aluminum alloy plate 11 and the prepreg 12. Then, PTEF blocks 14 and 15 of PTEF (polytetrafluoroethylene resin) are set on top thereof as weights. In addition, where necessary, weights of several hundred grams (not shown) are placed on top of the blocks. The resulting assembly is loaded in this state into a firing oven, where the prepreg is cured, then allowed to be cooled. The weights, seat 8 and the like are then removed and, by pushing the bottom end of the bottom plate projection 6 against the surface of the floor below, the aluminum alloy composite 10 (see FIG. 2) obtained by joining the aluminum plate with the CFRP can be removed together with the mold release films 13 and 17. The PTEF spacer 16 and the mold release films 17 and 13, being made of non-stick materials, can then be easily peeled from the CFRP.

[Examples of Methods for Using Composites]

Figure 3:
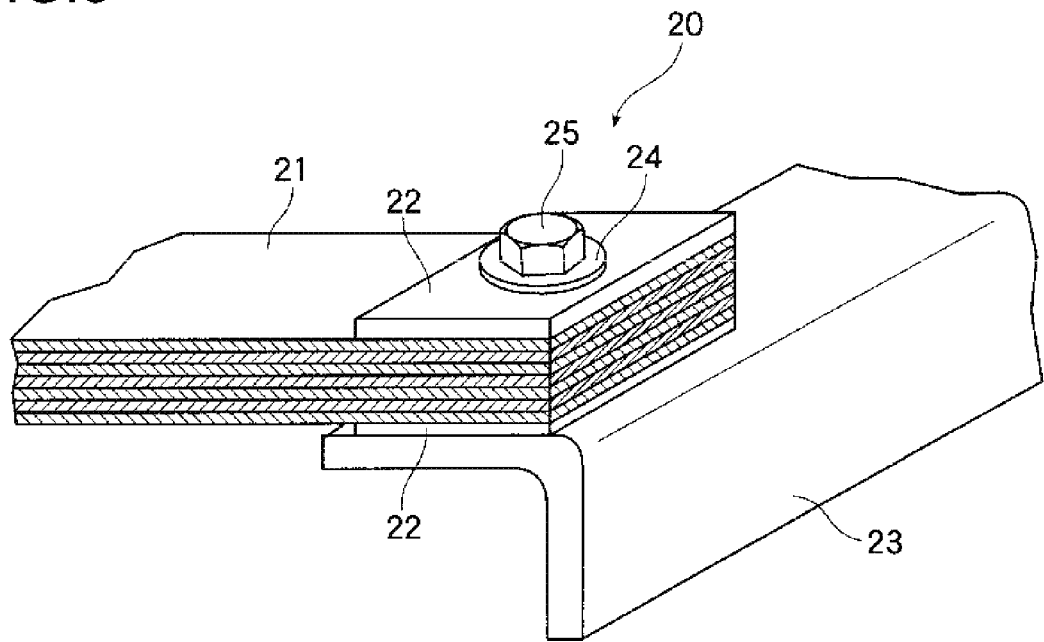
FIG. 3 is a schematic view showing an exemplified construction obtained by using bolts and nuts to join an aluminum alloy piece-FRP prepreg composite with another metal structural member.

FIG. 3 is a partial solid view showing an example in which an aluminum alloy/FRP composite according to the present invention and a metal structural material (angle bar) are joined together using bolts and nuts. The aluminum alloy composite 20 is a composite obtained by uniting an aluminum alloy with CFRP. The CFRP 21 is a plate-like structure produced by firing the prepreg. The angle bar 23 is a prefabricated structural material. Rectangular reinforcing plates 22 are integrally joined with the front and back sides of the CFRP 21. The reinforcing plates 22 are made of aluminum alloy (e.g., A7075) and have been fired and integrally joined beforehand with the CFRP 21 by the above-described method.

The CFRP 21, the reinforcing plates 22 on the front and back sides thereof and the angle bar 23 are fastened together so that no movement occurs therebetween by means of a bolt 25 along with a nut placed on the underside of the angle bar 23 (not shown) through an upper washer 24 placed on the reinforcing plate 22 and a lower washer (not shown) placed on the bottom face of the angle bar 23. In the aluminum alloy composite 20 obtained by joining together rectangular plates 22 made of aluminum alloy (A7075) and CFRP 21, the joining strength between both materials is extremely high, the shear breaking strength being from 50 to 70 MPa. Moreover, the forces applied to the plates 22 by the bolt 25 and washer 24 or the like can be effectively dispersed on the CFRP 21. In short, even when the bolt 25 and nut are tightened with sufficient strength, only the plates 22 made of A7075 are deformed; the CFRP 21 in the composite 20 is not damaged. An aluminum alloy and CFRP can be strongly joined by the method for manufacturing an aluminum alloy composite according to the present invention as stated above.

As described in detail above, in the aluminum alloy composite and method for manufacturing thereof according to the present invention, an aluminum alloy part and FRP are strongly united, thereby enabling tough, lightweight components to be produced. Because parts obtained by integrally uniting an aluminum alloy member with an FRP member can be manufactured as parts for aircrafts and other applications, novel constructions may be employed when the need arises to join and fasten both materials.

Also, because the aluminum alloy composite according to the present invention is light, it can be employed in components for vehicles, such as parts for automotives and parts for bicycles, where lighter weight is strongly desired. That is, because the aluminum alloy stock can be formed in a relatively free shape by mechanical working or the like, existing fastening methods such as a bolt-and-nut technique or a screwing technique can be employed to join two pieces of aluminum alloy. FRP parts, on the other hand, are suitable for forming objects with plate-like or pipe-like shapes rather than complex shapes and even make it possible to create large or elongated cured objects. As a result, composite structures can be produced which exhibit the characteristics of both materials.

Hence, by having the end of a integrally united part made of aluminum alloy, it is possible to arrive at a member capable of being easily assembled with nuts and bolts or with screws. In summary, by precisely designing the surface of the aluminum alloy, the joining strength and accuracy in joining with the epoxy resin can be made vastly high, making it possible to employ new methods of fabrication and assembly that utilize such joining strength.

Figure 4:
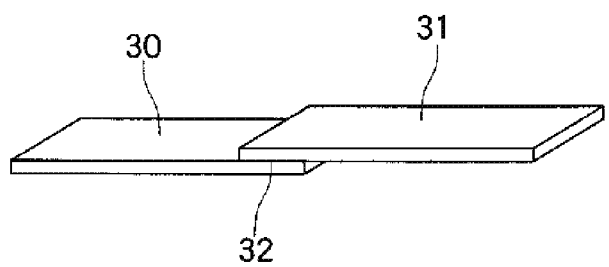
FIG. 4 shows a test specimen obtained by joining together two pieces of aluminum alloy with an epoxy adhesive, the purpose of the specimen being to measure the joining strength between the aluminum alloy pieces by applying a tensile load to break.

Embodiments of the present invention will be described below by means of experiment examples. FIG. 4 shows the configuration in which two pieces of aluminum alloy are joined together with an adhesive (metal on metal). In the figure, aluminum alloy piece 30 and aluminum alloy piece 31 are aluminum alloy plates made of the same material respectively. Aluminum alloy piece 30 and aluminum alloy piece 31 are joined at a joining face 32. At this joining face 32, as described above, a micron-order surface roughness is formed by chemical etching at the surface. This surface has a thin layer of sodium ion-free aluminum oxide with a thickness of at least 2 nm and the interior of the surface roughness is covered by an ultra fine irregular surface with depressions and protrusions having a diameter of 10 to 100 nm and the same depth or height.

It is to these ultrafine irregular surfaces that joining has taken place through an intervening epoxy-based adhesive. FIG. 2 shows a test piece for measuring the joining strength obtained when an aluminum alloy plate and FRP are joined together with an epoxy-based adhesive. As explained above, FIG. 3 is a schematic view for a case in which a composite obtained by joining an aluminum alloy plate and FRP with epoxy resin is connected with another metal part by means of bolts and nuts. Specific working examples will be described subsequently. The following instruments were used for obtaining measurements.

(a) X-Ray Surface Examination (X-Ray Photoelectron Spectroscopy (XPS))

An ESCA spectrometer (AXIS-Nova, manufactured by Kratos/Shimadzu Corporation, Japan) was used to examine the constituent elements on a surface of several micrometers in diameter to a depth of 1 to 2 nm.

(b) Electron Microscopic Examination

Observation was carried out at 1 to 2 kV using scanning electron microscopes (SEM) (S-4800, manufactured by Hitachi, Ltd., Japan) and JSM-6700F (JEOL, Japan).

(c) Scanning Probe Microscopic Examination

A SPM-9600 (Shimadzu Corporation, Japan) was used.

(d) X-Ray Diffraction Analysis (XRD Analysis)

An XRD-6100 (Shimadzu Corporation, Japan) was used.

(e) Measurement of Joining Strength in Composite

Using a tensile testing machine (Model 1323, manufactured by Aikoh Engineering, Japan), the shear breaking strength was measured at a tension speed of 10 mm/min.

Working Examples

Experiment Example 1

Adhesion with A5052 Aluminum Alloy

Commercially available A5052 sheet stock having a thickness of 1.6 mm was acquired and cut to form a plurality of rectangular pieces measuring 45×18 mm. Water was made ready in a tank and a commercially available aluminum alloy degreaser (NE-6, available from Meltex, Japan) was added to the water to form a aqueous solution of 60° C. having a concentration of 7.5%. The rectangular pieces of aluminum alloy were immersed in the solution for 7 minutes and then thoroughly rinsed with water. An aqueous solution of hydrochloric acid having a concentration of 1% and adjusted to 40° C. was made ready in another tank, in which the aluminum alloy pieces were immersed for 1 minute and then thoroughly rinsed with water. Next, an aqueous solution of caustic soda having a concentration of 1.5% and adjusted to 40° C. was made ready in still another tank, in which the same aluminum alloy pieces were immersed for 2 minutes and then thoroughly rinsed with water. An aqueous solution of nitric acid having a concentration of 3% and adjusted to 40° C. was made ready in yet another tank, in which the aluminum alloy pieces were subsequently immersed for 1 minute and then rinsed with water.

Next, an aqueous solution containing hydrazine monohydrate by 35% and adjusted to 60° C. was made ready in another tank, in which the aluminum alloy pieces were immersed for 1 minute, rinsed with water and then dried by being placed in a hot-air dryer set at 67° C. for 15 minutes. After drying, the aluminum alloy pieces were collected together, wrapped with aluminum foil and then placed in a plastic bag, which was closed and stored. Four days later, one of the pieces was examined with an electron microscope and found to be covered with depressions of diameters ranging from 10 to 80 nm and a number-average diameter of 25 to 30 nm.

Figure 15:
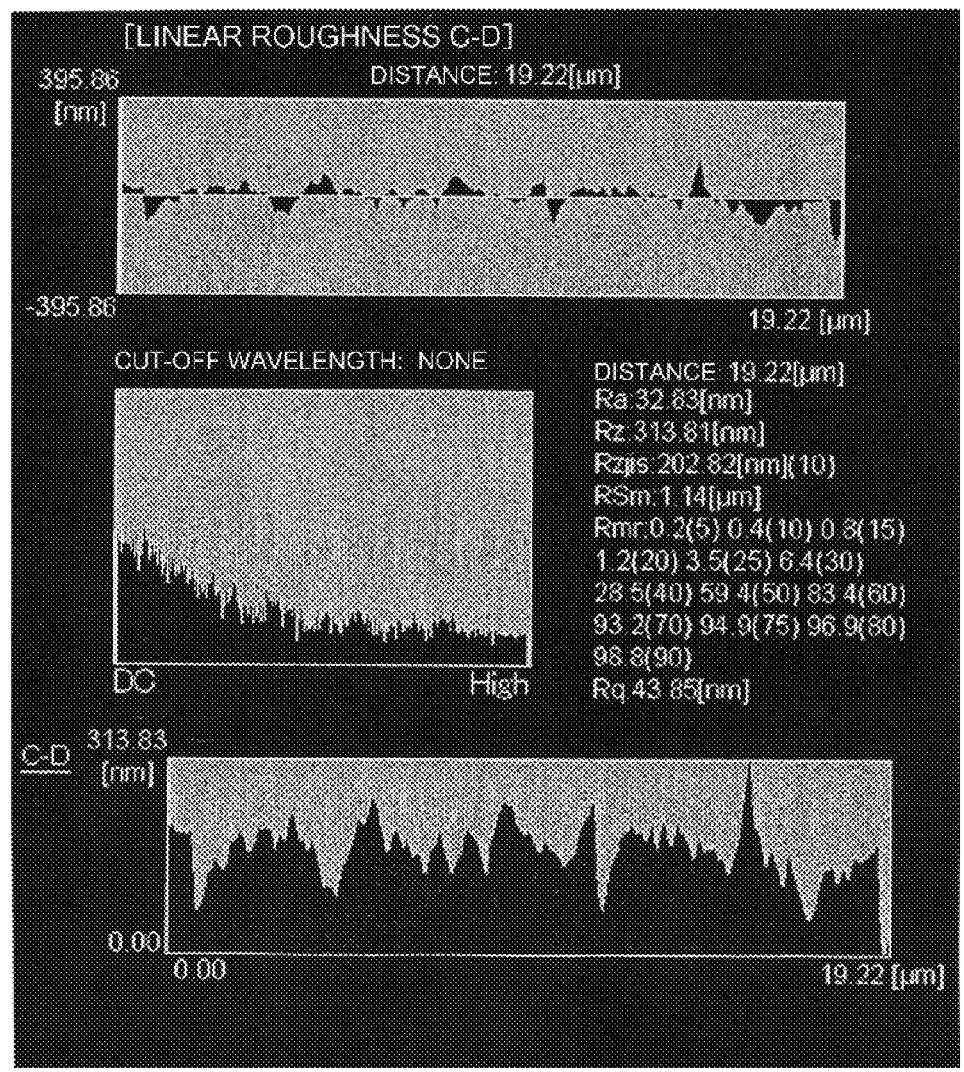
FIG. 15 shows the results by observation of the A5052 aluminum alloy obtained in Experiment example 1 with a scanning probe microscope.

This is shown in the micrograph of FIG. 9. Another piece was examined with a scanning probe microscope, with which the piece was scanned over a length of 20 μm at 40 μm/s, and the mean peak spacing (RSm) and maximum height (Rz) according to JIS B 0601: 2001 were measured, yielding respective results of 1.1 μm (RSm) and 0.3 μm (Rz). FIG. 15 shows these roughness curves. In addition, still another piece was subjected to examination with XPS and aluminum atoms were observed. In contrast with the purchased A5052, which was observed to have a ratio of zero-valent aluminum to trivalent aluminum of about 1:3, the piece, for which surface treatment was carried out, showed no sign of zero-valent aluminum and the thickness of the aluminum oxide layer had increased. Because the atomic composition to a depth of up to 1 to 2 nm from the surface was detected in XPS, it was apparent that the aluminum oxide surface layer had a thickness of more than 2 nm.

The same day, ten pieces of aluminum alloy for which surface treatment had been performed as described above were taken out and lightly coated on the ends with a commercially available liquid-type one-pack dicyandiamide-curable epoxy adhesive (EP-106, available from Cemedine, Japan). The pieces were placed in a desiccator with the coated side facing upward, the desiccator was evacuated with a vacuum pump to 1 mmHg and left in this state for one minute, following which air was introduced, returning the interior to standard pressure. This operation of reducing the pressure and then returning to standard pressure was repeated three times, following which the pieces were removed from the desiccator. The pieces were transferred to the interior of a hot-air dryer and assembled into five pairs by stacking two pieces with the adhesive-coated sides mating with one another so that each joined face area was about 0.5 cm$^2$, a weight of 500 g was placed at each joined face, the door was closed and the temperature was rapidly raised to 135° C. Forty minutes later, the hot-air dryer setting was changed to 165° C. and the rise in temperature was awaited. Once the temperature reached 165° C., this state was held for 20 minutes, then the power on the hot-air dryer was turned off, the door of the dryer was opened and the interior was allowed to be cooled. By means of this operation, as shown in FIG. 4, united test pieces composed of a first aluminum alloy piece 30 and a second aluminum alloy piece 31 joined at the joining face 32 respectively were obtained. Two days later, the test pieces were subjected to tensile breaking tests, whereupon the average shear strength at break for the five pairs was 48 MPa, which was very strong.

Experiment Example 2

Adhesion with A5052 Aluminum Alloy

Surface treatment for pieces of A5052 plate was carried out in the same way as Experiment example 1. Up through treatment with the degreaser (NE-6, available from Meltex, Japan), preliminary pickling treatment with a 1%-aqueous solution of hydrochloric acid and alkali etching treatment with a 1.5%-aqueous solution of caustic soda, treatment was carried out in exactly the same as in Experiment example 1. Surface treatment ended at this point and the pieces were stored in the resulting state. The same day, these aluminum alloy pieces were taken out, the epoxy adhesive EP-106 was lightly coated on the ends and desiccation treatment, joining and curing of the adhesive in a hot-air dryer were subsequently carried out in exactly the same way as in Experiment example 1, yielding the test pieces shown in FIG. 4.

In tensile failure tests carried out two days later, the average shear strength at break for the four pairs was 48 MPa. These test pieces thus exhibited the same high joining strength as in Experiment example 1. The aluminum alloy pieces following surface treatment were subjected to XPS analysis, where large peaks for oxygen and aluminum were observed and small peaks for magnesium, zinc and sodium were also noted. In this experiment example, in which surface treatment ended with treatment in an aqueous solution of caustic soda, it was shown that sodium ions are not removed by rinsing with water alone.

Experiment Example 3

Adhesion with A5052 Aluminum Alloy

Pieces of A5052 plate were treated in the same way as Experiment example 1 up to a given point. Up through treatment with the degreaser NE-6, preliminary pickling treatment with a 1%-aqueous solution of hydrochloric acid, alkali etching treatment with a 1.5%-aqueous solution of caustic soda and neutralization treatment with a 3%-aqueous solution of nitric acid, treatment was carried out in exactly the same as in Experiment example 1. Surface treatment ended at this point and the pieces were stored in this state.

When these aluminum alloy pieces were subjected to XPS analysis, peaks for sodium were not observed, even cumulatively. Hence, sodium was concluded to have been removed by immersion in the aqueous nitric acid solution and rinsing with water. The same day, these aluminum alloy pieces were taken out, the epoxy adhesive EP-106 was lightly coated on the ends and desiccation treatment, joining and curing of the adhesive in a hot-air dryer were subsequently carried out in exactly the same way as in Experiment example 1. In tensile breaking tests carried out two days later, the average shear strength at break for the four pairs was 44 MPa. The joining strength was somewhat lower than in Experiments 1 and 2.

Experiments Example 4 to 12

Adhesion with A5052 Aluminum Alloy

In Experiment examples 4, 5 and 6, surface treatment up to immersion in an aqueous solution of hydrazine hydrate was carried out in the same way as in Experiment 1. Compared with Experiment example 1, only the immersion times in the aqueous solution of caustic soda were made different. These immersion times were 1 minute in Experiment example 4, 2 minutes in Experiment example 1, 4 minutes in Experiment example 5 and 8 minutes in Experiment example 6. In Experiment examples 7, 8 and 9, surface treatment up to immersion in an aqueous solution of caustic soda was carried out in the same way as in Experiment example 2. Compared with Experiment 2, only the immersion times in the aqueous solution of caustic soda were made different. These immersion times were 1 minute in Experiment example 7, 2 minutes in Experiment example 2, 4 minutes in Experiment example 8 and 8 minutes in Experiment example 9.

In Experiments examples 10, 11 and 12, surface treatment up to immersion in an aqueous solution of nitric acid soda was carried out in the same way as in Experiment example 3. Compared with Experiment example 3, only the immersion times in the aqueous solution of caustic soda were made different. These immersion times were 1 minute in Experiment example 10, 2 minutes in Experiment example 3, 4 minutes in Experiment example 11 and 8 minutes in Experiment example 12. The results for Experiment examples 1 to 12 are shown in Table 1. The same results are plotted as graphs in FIG. 13. The ordinate represents the adhesive strength between the A5052 aluminum alloy pieces and the abscissa represents the immersion time in a 1.5%-aqueous solution of caustic soda.

TABLE 1

Shear strength at break of A5052.

| | Immersion time in 1.5%-caustic soda solution | | | |
|---|---|---|---|---|
| Treatment step | 1 minute | 2 minutes | 4 minutes | 8 minutes |
| (1) Up to caustic soda treatment | Experiment example 7 | Experiment example 2 | Experiment example 8 | Experiment example 9 |
| Joining strength | 32 Mpa | 48 Mpa | 45 Mpa | 35 Mpa |
| (2) Up to neutralization treatment | Experiment example 10 | Experiment example 3 | Experiment example 11 | Experiment example 12 |
| Joining strength | 20 Mpa | 44 Mpa | 41 Mpa | 40 Mpa |
| (3) Up to hydrazine treatment | Experiment example 4 | Experiment example 1 | Experiment example 5 | Experiment example 6 |
| Joining strength | 29 Mpa | 48 Mpa | 45 Mpa | 36 Mpa |

Figure 13:
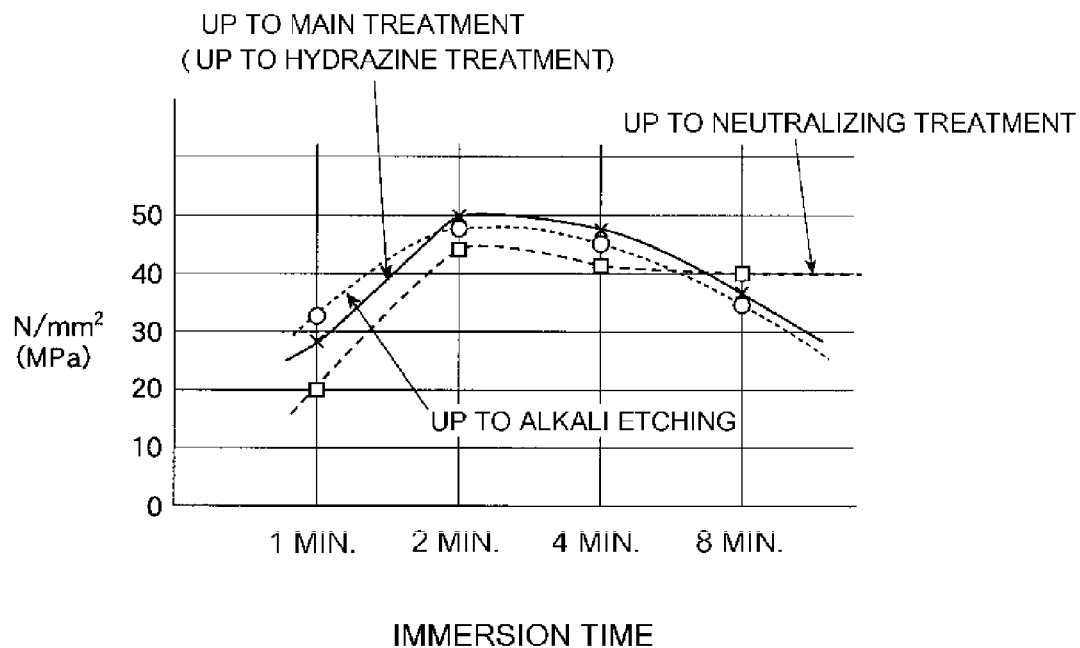
FIG. 13 is a graph of the results presented in Table 1.

As is apparent from FIG. 13 and Table 1, using a combination of A5052 treated with a 1.5%-aqueous solution of caustic soda and epoxy resin composition EP-106, the highest joining strength is obtained at an immersion time of about 2 minutes in the aqueous solution of caustic soda. What is distinctive here is that, among the test pieces which were immersed for 2 minutes in an aqueous solution of caustic soda, the product etched with caustic soda (Experiment example 2) and the product obtained by subsequent neutralization as well as hydrazine treatment (Experiment example 1) exhibited substantially the same level of joining strength. Of the treated products in which sodium ions were not present, those subjected to treatment up to hydrazine treatment exhibited the highest adhesive strength.

Also, in cases where the immersion time in an aqueous solution of caustic soda was 8 minutes, etc., when the A5052 aluminum alloy pieces were etched too long, the product treated up to neutralization (Experiment example 12) had the highest joining strength. In comparing the product obtained by surface treatment up to immersion in a caustic soda solution with the product obtained by surface treatment up to immersion in a hydrazine solution, the results were reversed. Long immersion in an aqueous solution of caustic soda resulted in a roughness periodicity of several microns, with little difference in the period itself. However, the depth and height difference were changed drastically (based on examination with scanning probe microscope) and lateral holes even formed, resulting in an excessively complex surface shape which was thought to have weakened the joining strength.

Because neutralization treatment is a step that actually involves immersion in an acidic aqueous solution, aluminum alloy, being an amphoteric metal, dissolves slightly even in acidic water; in particular, protruding portions reportedly dissolve easily particularly in an acidic aqueous solution. Therefore, it is considered that Experiment example 12 exhibited a better adhesive strength than in Experiment example 9 because the excessively complex roughness was leveled out somewhat, returning to a suitable degree of roughness.

Experiment Examples 13 to 15

Adhesion with A5052 Aluminum Alloy

Joining/breaking experiments were carried out in the same way as in Experiment example 1. However, unlike in Experiment example 1, the immersion time in the 1.5%-aqueous solution of caustic soda was set to 2 minutes, the best time in Experiment examples 1 to 12 and the immersion time in the 3.5%-aqueous solution of hydrazine hydrate was varied in the range of 1 to 8 minutes.

That is, the immersion time was set to 1 minute in Experiment example 1, 2 minutes in Experiment example 13, 4 minutes in Experiment example 14 and 8 minutes in Experiment example 15. The results are shown in Table 2 and FIG. 14.

TABLE 2

Shear strength at break of A5052 (with 2 minutes immersion in 1.5%-aqueous caustic soda)

| | Hydrazine hydrate immersion time | | | |
|---|---|---|---|---|
| | 1 minute Experiment example 1 | 2 minutes Experiment example 13 | 4 minutes Experiment example 14 | 8 minutes Experiment example 15 |
| Joining strength | 48 Mpa | 60 Mpa | 41 Mpa | 28 Mpa |

Figure 14:
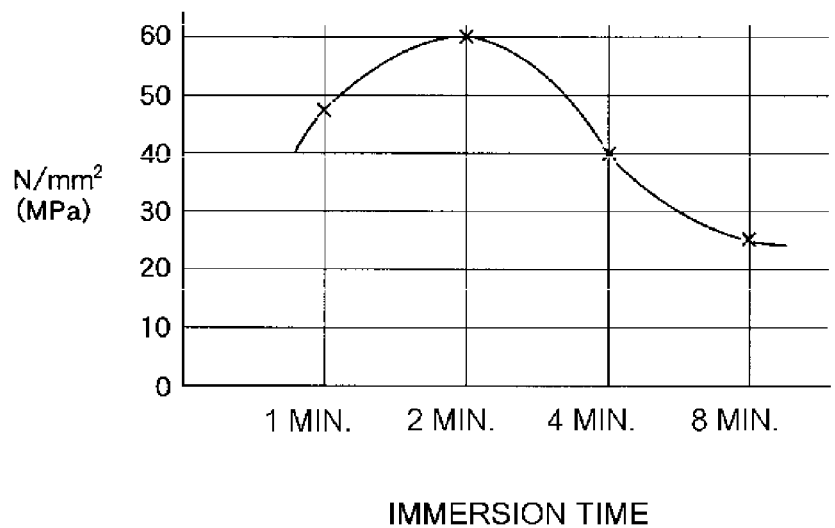
FIG. 14 is a graph of the results presented in Table 2.

As shown in Table 2 and FIG. 14, the highest joining strengths were obtained with an immersion time of 2 minutes in an aqueous solution of hydrazine hydrate. Examination of the surface with an electron microscope showed that the entire surface was covered with depressions having a diameter ranging from 20 to 100 nm and a number-average diameter of 40 to 50 nm. A joining force of 60 MPa (about 600 kgf/cm$^2$) corresponds to a breaking force of 300 kgf for an object having a joining face area of 0.5 cm$^2$. FIGS. 9, 10, 11 and 12 show electron micrographs of the A5052 aluminum alloys obtained in Experiment examples 1, 13, 14 and 15 at magnifications of 10,000 times and 100,000 times respectively. It can be seen from these that, as the immersion time increases, the finely textured surface becomes more complex, in this case the diameter of the fine depressions becomes larger and other depressions are formed within the earlier formed depressions, leading to a rapid decline in the strength of the surface layer itself on the aluminum alloy.

It will be appreciated that, on a surface like that shown in the electron micrograph of FIG. 12, a viscous epoxy-based adhesive will be unable to penetrate deep into the complex fine depressions. Further, on examining the same aluminum alloy piece as used in Experiment example 13, for which the highest joining strength was exhibited, with a scanning probe microscope, the mean roughness period (this is the same as the mean peak spacing RSm according to JIS) was 1.2 µm and the maximum height (Rz) was 0.5 µm.

Experiment Example 16

Adhesion with A5052 Aluminum Alloy

As in Experiment example 13, pieces of A5052 sheet stock were degreased and rinsed with water, subjected to preliminary pickling and rinsed with water, etched with an aqueous solution of caustic soda and rinsed with water, neutralized with an aqueous solution of nitric acid and rinsed with water, then finely etched with an aqueous solution of hydrazine monohydrate and rinsed with water. Next, the pieces for which surface treatment was performed were placed in a hot air dryer set to 150° C. for 15 minutes and dried. That is, while the drying temperature in Experiment example 13 was set to 67° C., the wet A5052 following rinsing was directly loaded at an elevated temperature of 150° C. and dried in this experiment example. This is the difference with Experiment example 13.

Exactly the same procedure as in Experiment example 1 was subsequently followed. Using the epoxy adhesive EP-106, two pieces of aluminum alloy at a time were adhesively joined with each other. On the following day after joining, the resulting test pieces were subjected to tensile breaking tests, whereupon the average shear strength at break for the four pairs was 43 MPa. This joining strength was lower than in Experiment example 13. Guessing on the basis of prior art, it would appear that, when a piece containing some amine-based compound stands in a wet state at an elevated temperature of more than 100° C., boehmite formation occurs at the surface. The inventors, suspecting that boehmite containing hydroxyl groups is not always a substance having a tough hardness, thought the results to be reasonable.

Experiment Examination 17

Adhesion with A5052 Aluminum Alloy

As in Experiment example 13, pieces of A5052 sheet stock were degreased and rinsed with water, subjected to preliminary pickling and rinsed with water, etched with an aqueous solution of caustic soda and rinsed with water, neutralized with an aqueous solution of nitric acid and rinsed with water, then finely etched with an aqueous solution of hydrazine monohydrate and rinsed with water. In addition, an aqueous solution of hydrogen peroxide having a concentration of 5% was adjusted to 25° C. and the pieces were immersed therein for 5 minutes, then rinsed with water. The aluminum alloy pieces were then dried by being placed in a hot-air dryer set to 67° C. for 15 minutes. Next, as in Experiment example 1, two of the aluminum alloy pieces were adhesively joined with each other at a time using the amine-curable epoxy adhesive EP-106 (available from Cemedine, Japan). On the following day after joining, the resulting test pieces were subjected to tensile breaking tests, whereupon the average shear strength at break for the four pairs was 62 MPa, which was very high.

Experiment Example 18

A7075 Aluminum Alloy

Commercially available A7075 sheet stock having a thickness of 3 mm was acquired and cut to form a plurality of rectangular pieces measuring 50×12 mm. Water was made ready in a tank and the commercially available aluminum alloy degreaser NE-6 was added to the water to form an aqueous solution of 60° C. having a concentration of 7.5%. The pieces of aluminum alloy were immersed in the solution for 5 minutes, then thoroughly rinsed with water. An aqueous solution of hydrochloric acid having a concentration of 1% and adjusted to 40° C. was made ready in another tank and the aluminum alloy pieces were immersed therein for 1 minute, then thoroughly rinsed with water. Next, an aqueous solution of caustic soda having a concentration of 1.5% was made ready in still another tank and the same aluminum alloy pieces were immersed therein for 4 minutes, then thoroughly rinsed with water. The aluminum alloy pieces were then dried by being placed in a hot-air dryer set at 67° C. for 15 minutes. After drying, the aluminum alloy pieces were collected together and wrapped with aluminum foil, then placed in a plastic bag, which was closed and stored.

Four days later, one of the pieces was examined with an electron microscope. The micrograph obtained is shown in FIG. 5. A strange, dried seaweed-like surface having diameter of 100 to 150 nm is apparent. This was subjected to XPS analysis, whereupon large peaks for oxygen and aluminum and small peaks for magnesium, copper, zinc and sodium were noted. In this case, surface treatment was completed with treatment using an aqueous solution of caustic soda and it was apparent that rinsing with water was not sufficient to completely remove the sodium ions.

Experiment Example 19

A7075 Aluminum Alloy

Commercially available A7075 sheet stock having a thickness of 3 mm was acquired and cut to form a plurality of rectangular pieces measuring 50×12 mm. Water was made ready in a tank and the commercially available aluminum alloy degreaser NE-6 was added to the water to form an aqueous solution of 60° C. having a concentration of 7.5%. The pieces of aluminum alloy were immersed in the solution for 5 minutes, then thoroughly rinsed with water. An aqueous solution of hydrochloric acid having a concentration of 1% and adjusted to 40° C. was made ready in another tank and the aluminum alloy pieces were immersed therein for 1 minute, then thoroughly rinsed with water. Next, an aqueous solution of caustic soda having a concentration of 1.5% was made ready in still another tank and the same aluminum alloy pieces were immersed therein for 4 minutes, then thoroughly rinsed with water. Next, an aqueous solution of nitric acid having a concentration of 3% and adjusted to 40° C. was made ready in another tank and the aluminum alloy pieces were immersed therein for one minute, then rinsed with water. Compared with Experiment example 18, this was an experiment example in which the step of immersion in an aqueous solution of nitric acid was added to the steps in Experiment example 18.

Next, the aluminum alloy pieces were dried by being placed in a hot air dryer set at 67° C. for 15 minutes. After drying, the aluminum alloy pieces were collected together, wrapped with aluminum foil and then placed in a plastic bag, which was closed and stored. Four days later, one of the pieces was examined with an electron microscope. The micrograph obtained is shown in FIG. 6. Compared with FIG. 5, the difference was dramatic. While the periodicity of the depressions and protrusions remained the same, the protuberant features in the dried seaweed-like pattern had all disappeared, resulting in a shape in which only low protrusions remained. The surface had clearly become smoother, even when seen at a microscopic level. Such a surface showed little promise of a high joining strength with adhesive.

Experiment Example 20

A7075 Aluminum Alloy

Commercially available A7075 sheet stock having a thickness of 3 mm was acquired and cut to form a plurality of rectangular pieces measuring 50×12 mm. Water was made ready in a tank and the commercially available aluminum alloy degreaser NE-6 was added to the water to form an aqueous solution of 60° C. having a concentration of 7.5%. The rectangular pieces of aluminum alloy were immersed in the solution for 5 minutes, then thoroughly rinsed with water. Next, an aqueous solution of hydrochloric acid having a concentration of 1% and adjusted to 40° C. was made ready in another tank and the aluminum alloy pieces were immersed therein for 1 minute, then thoroughly rinsed with water.

Next, an aqueous solution of caustic soda having a concentration of 1.5% was made ready in still another tank and the aluminum alloy pieces were immersed therein for 4 minutes, then thoroughly rinsed with water. An aqueous solution of nitric acid having a concentration of 3% and adjusted to 40° C. was made ready in another tank and the aluminum alloy pieces were immersed therein for one minute, then rinsed with water. Next, an aqueous solution containing hydrazine monohydrate by 3.5% and adjusted to 60° C. was made ready in yet another tank and the aluminum alloy pieces were immersed therein for 2 minutes, following which they were thoroughly rinsed with water, then dried by being placed for 15 minutes in a hot air dryer set to 67° C. Compared with Experiment example 19, this was an experiment in which the step of immersion in an aqueous solution of hydrazine hydrate was added to the steps in Experiment example 19. After drying, the aluminum alloy pieces were collected together, wrapped with aluminum foil and then placed in a plastic bag, which was closed and stored.

Four days later, one of the pieces was examined with an electron microscope. The micrograph obtained is shown in FIG. 7. As is apparent when compared with FIG. 6, a strange pattern that resembles jumbled piles of stones or boulders of 20 to 110 nm in diameter can be seen. Judging from FIG. 7 (with magnification of 10,000 times), the surface appears to be covered by depressions having diameters of between 40 and 100 nm, with the number-average diameter being 60 nm. In an XPS examination of another of the pieces, peaks for zero-valent aluminum such as those in Experiment example 1 were not observed.

The same day, the aluminum alloy pieces were taken out and lightly coated on the respective ends with the commercially available epoxy adhesive EP-106. The pieces were placed in a desiccator with the coated side facing upward, then the desiccator was evacuated with a vacuum pump to 1 mmHg and left in this state for one minute, following which air was introduced, returning the interior to standard pressure. This operation of reducing the pressure and then returning to standard pressure was repeated three times, following which the pieces were removed from the desiccator. These aluminum alloy pieces were transferred to the interior of a hot air dryer and assembled into pairs by stacking two pieces with the adhesive-coated sides placed against one another at a time so that each joined face had an area of about 0.5 cm$^2$, a 500 g weight was placed at each joined face, the door was closed and the temperature was rapidly raised to 135° C.

Forty minutes later, the hot air dryer setting was changed to 165° C. and the rise in temperature was awaited. Once the temperature had reached 165° C., this state was held for 20 minutes, then the power on the hot air dryer was turned off, the door of the dryer was opened and the interior was allowed to be cooled. In tensile breaking tests conducted two days later on the resulting test pieces, the average shear strength at break for the four pairs was 65 MPa, which was very high.

Experiment example 21

Adhesion with A7075 Aluminum Alloy

In a similar way as in Experiment example 20, pieces of A7075 sheet stock were degreased and rinsed with water, subjected to preliminary pickling and rinsed with water, etched with an aqueous solution of caustic soda and rinsed with water, neutralized with an aqueous solution of nitric acid, cleaned with water and supersonic vibration, again immersed in an aqueous solution of nitric acid and rinsed with water, then finely etched with an aqueous solution of hydrazine monohydrate and rinsed with water. In addition, an aqueous solution of hydrogen peroxide having a concentration of 5% was adjusted to 25° C. and the aluminum alloy pieces were immersed therein for 5 minutes, then rinsed with water. The pieces were subsequently dried by being placed for 15 minutes in a hot air dryer set to 67° C.

Four days later, one of the pieces was examined with an electron microscope. The results are shown in FIG. 8. The transition from FIGS. 7 to 8 is due to the aqueous hydrogen peroxide, although how to describe the change in the images is not an easy matter. While there is not a substantial difference in the periodicity of the fine depressions and protrusions, FIG. 8 appears to show a well-defined shapes without underlying features. One gets the sense that crystallization of the aluminum oxide has proceeded. Yet, when XRD analysis was carried out, peaks for aluminum oxide crystal were not observed. Observation with XRD is impossible without a certain amount of crystals; it is impossible to determine whether the aluminum oxide was microcrystalline or was still amorphous. Another piece was subjected to examination with a scanning probe microscope and data on the roughness obtained. According to the results, the mean peak spacing (RSm) was 3.5 µm and the maximum height (Rz) was 1.8 µm.

Next, in a similar way as in Experiment example 20, the aluminum alloy pieces were adhesively joined together, two pieces at a time, using the epoxy adhesive EP-106. On the second day after joining, tensile breaking tests were carried out, whereupon the four pairs had an average shear strength at break of 70 Mpa, which was very high.

Experiment Example 22

Adhesion with A7075 Aluminum Alloy

A plurality of square rod-shaped pieces measuring 3×4×18 mm were formed by cutting and mechanically working commercially available A7075 sheet stock having a thickness of 3 mm. Each of these pieces, with a hole of 1.5 mm in diameter formed at an end thereof, was shaped so as to facilitate liquid treatment, after which the pieces were used in the following experiment. Specifically, liquid treatment was carried out in exactly the same way as in Experiment example 21. Next, an epoxy adhesive was applied on the end face on the side opposite to that where the hole was formed, the pieces were placed in a desiccator and pressure reduction/standard pressure recovery operations were carried out in the same way as in Experiment example 21. Next, two pieces were butted end-to-end, creating three pairs of joined objects having lengths of about 36 mm. Specifically, with the two pieces mutually abutting in each pair, a tacky tape was wrapped around the vicinity of the junction to keep the two pieces from separating and to keep the adhesive from spilling out when the viscosity is lowered under elevated temperature. The three pairs wrapped about with tacky tapes were placed horizontally on a plate inside a hot air dryer and weights were set on both ends to keep them from extending, following which heating was carried out in exactly the same way as in Experiment example 21.

This experiment was carried out in order to measure the tensile strength at break for pieces of A7075 stock which had been joined with an epoxy adhesive. Tensile break tests were carried out on the resulting joined object with the tensile testing machine, yielding an average value of 85 kgf. Given the joining surface area of 0.12 cm², a tensile strength at break of 69 MPa was obtained. The average thickness of the adhesive layer at this time was 0.25 mm. While there may be no special significance, it was striking to note that the shear strength at break and the tensile strength at break were substantially identical values, both being close to 70 MPa.

Experiment Example 23

Adhesive

A commercially available liquid single-pack dicyandiamide-curable epoxy adhesive EP-106 (available from Cemedine, Japan) was acquired. Separately, the ethylene-acrylic acid ester-maleic anhydride terpolymer Bondine TX8030 (available from Arkema, France) was acquired, freeze-fractured at a liquid nitrogen temperature to obtain a powder that passes through a 30 µm screen. In addition, glass fibers having an average fiber diameter of 9 µm and a fiber length of 3 mm (RES03-TP91, available from Nippon Sheet Glass, Japan) were acquired and lightly ground in a mortar. 100 g of the epoxy adhesive EP-106, 5 g of the above powdered polyolefin resin and 10 g of the above glass fibers were placed in a polyethylene beaker, thoroughly stirred and left to stand for one hour, after which the contents were again stirred to blend together the ingredients. This mixture was used as the epoxy adhesive composition.

Aside from using the resulting adhesive composition in place of EP-106, this experiment was carried out in exactly the same way as Experiment example 21. Two days after curing the adhesive, the test pieces were subjected to tensile breaking tests, whereupon the average shear strength at break for the four pairs was 69 MPa. Based on the results from Experiment examples 1 to 21, it is apparent that the joining strength is basically determined by the shape and physical properties of the metal surface. As the results in this experiment are substantially the same as those in Experiment example 20, this fact appears to indicate that the basic performance of the adhesive itself is unchanged between this experiment and EP-106. In fact, because the adhesive in this experiment contains elastomer and the linear expansion coefficient ought to be close to that of metal owing to the admixture of filler, it is expected from common knowledge in the art that good results should be achievable after experiencing vibrations or after experiencing elevated temperatures.

Experiment Example 24

Adhesive

The commercially available epoxy adhesive EP-106 was acquired. In addition, the glycidyl methacrylate-ethylene copolymer Bondfast E (available from Sumitomo Chemical, Japan), which is a polyolefin resin, was acquired and freeze-fractured at a liquid nitrogen temperature to obtain a powder that passes through a 30 ηm sieve. 100 g of the epoxy adhesive EP-106, 5 g of the above powdered polyolefin resin and 10 g of the glass fibers RES03-TP91 were placed in a polyethylene beaker, thoroughly stirred and left to stand for one hour, after which the contents were again stirred to blend together the ingredients. This mixture was used as the epoxy adhesive composition. Aside from using the resulting adhesive composition in place of EP-106, this experiment was carried out in exactly the same way as Experiment example 21. Two days after curing the adhesive, the test pieces were subjected to tensile breaking tests, whereupon the average shear strength at break for the four pairs was 70 MPa.

Experiment Example 25

Fabrication of Commercial-Type Prepreg

Ten parts by weight of a commercially available brominated bisphenol A-type solid epoxy resin (EPC-152, available from Dainippon Ink & Chemicals, Japan), 13.9 parts by weight of a bisphenol A-type liquid epoxy resin (EP-828, available from Yuka Shell Epoxy, Japan), 15 parts by weight of tetraglycidyl diaminodiphenylmethane (ELM-434, available from Sumitomo Chemical, Japan), 24.8 parts by weight of a bisphenol F-type liquid epoxy resin (EPC-830, available from Dainippon Ink & Chemicals, Japan), 25 parts by weight of 4,4'-diaminodiphenylsulfone (4,4'-DDS, available from Sumitomo Chemical, Japan) as curing agents and 0.3 part by weight of $BF_3$-monoethylamino complex (BF3.MEA), 8 parts by weight of a weakly crosslinked carboxyl-terminated solid acrylonitrile butadiene rubber (DN-611, available from Nippon Zeon, Japan) and 3 parts by weight of the thermoplastic resin hydroxyl-terminated polyether sulfone (PES-100P, available from Mitsui Toatsu Chemicals, Japan) (the total amount of these ingredients being 100 parts by weight) were mixed at standard temperature and the mixture was formed into a sheet using rollers.

The resulting resin films were set in a prepreg machine and were joined under applied pressure from both sides of carbon fibers (T-300, available from Toray, Japan) arranged in parallel in one direction as reinforcing fibers by a conventional method, thereby forming a prepreg having a resin content adjusted to 38%. The fiber basis weight was 190 $g/m^2$. Prepregs commercially available from various domestic corporations appear to be manufactured by this type of method.

Experiment Example 26

Production and Evaluation of a Composite

A5052 aluminum alloy sheet stock having a thickness of 1.6 mm was cut to form a plurality of rectangular pieces measuring 45×15 mm. Liquid treatment on these pieces was performed in the same way as in Experiment example 18. That is, the pieces were, in order, degreased with an aqueous solution of the aluminum alloy degreaser NE-6 and rinsed with water, subjected to preliminary pickling in a 1%-aqueous solution of hydrochloric acid and rinsed with water, alkali etched in a 1.5%-aqueous solution of caustic soda and rinsed with water, neutralized in a 3%-aqueous solution of nitric acid and rinsed with water, finely etched in an aqueous solution of hydrazine monohydrate and rinsed with water, oxidized in an aqueous solution of hydrogen peroxide and rinsed with water and finally dried by being placed for 15 minutes in a hot air dryer set to 67° C.

After drying, the aluminum alloy pieces were collected together, wrapped in aluminum foil and stored. On the same day, the aluminum alloy pieces were taken out and the liquid single-pack dicyandiamide-curable epoxy adhesive EP-106 (available from Cemedine, Japan) was lightly applied to the ends. The pieces were then placed in a desiccator with the adhesive-coated sides facing upward, the pressure was reduced to 3 mmHg with a vacuum pump and left in that state for 1 minute, following which air was introduced, returning the desiccator to standard pressure. This operation of reducing the pressure and then returning to standard pressure was repeated three times, following which the pieces were removed from the desiccator.

Meanwhile, the firing jig 1 shown in FIG. 1 was set up, a mold release film 17 obtained by cutting 0.05 mm-polyethylene film into strips was laid down within the metallic mold body 2 and the aluminum alloy sheet 11 prepared above was placed thereon. A plain weave cloth of carbon fibers (T-300, available from Toray, Japan) that had been separately cut was laid down as the prepreg 12 in FIG. 1. Three layers were built up thereon while applying to the consecutive layered surfaces an epoxy adhesive (EP-106) discharged from a syringe. Next, a mold release polyethylene film piece 13 was placed on the aluminum alloy sheet 11 side, following which the size of the cloth was changed and five layers were similarly built up while again applying adhesive.

The amount of EP-106 used was about 1 cc. PTEF blocks 14 and 15 were placed on top of the polyethylene film pieces 13 to hold everything down and then the entire assembly was placed in a hot air dryer. Within the dryer, a 0.5 kg iron weight was placed on top of each PTEF block 14 and 15, following which the dryer was turned on and the temperature was raised to 135° C. Heating at 135° C. was carried out for 40 minutes, after which the temperature was raised further to 165° C. over a period of 5 minutes and the temperature was held at 165° C. for 20 minutes. The power was then turned off and the dryer was left to be in cooling state with the door closed. The next day, the assembly was taken out of the dryer, the shaped object was released from the mold and the polyethylene film pieces 13 and 17 were peeled off, giving the aluminum alloy composite 10 shown in FIG. 2. The same procedure was repeated to give eight pieces of aluminum alloy composite 10 obtained by uniting aluminum alloy with CFRP.

On the second day after joining, four pieces were subjected to tensile break tests. The CFRP portion was sandwiched between two pieces of 1 mm thick SUS304 stainless steel polished with sandpaper and the resulting assembly was secured by clamping between chuck plates. The average shear strength at break for the four pairs was 62 MPa, which was very strong. The joining surface area was calculated as l×m in FIG. 2.

Next, with regard to the remaining four pieces, the united objects were clamped in a tensile testing machine in the same way as described above and subjected to a strain of 30 MPa, at which point the pulling operation was stopped and the specimen was held in this state for 10 minutes. The chuck was subsequently loosened and the specimen was removed from the testing machine and allowed to rest. The next day, when these specimens were subjected to a tensile breaking test, the average shear strength at break was 60 MPa. There was thus no particular sign of a decline in the joining strength.

Experiment Example 27

Production and Evaluation of a Composite

Using 45×15 mm rectangular pieces of A5052 aluminum alloy sheet stock having a thickness of 1.6 mm like those in Experiment example 26, similar test pieces for measuring adhesive strength were fabricated. That is, adhesive-coated aluminum alloy pieces were prepared by applying an adhesive to the aluminum alloy, placing the adhesive-coated alloy pieces in a desiccator and repeating three times the operation of pressure reduction with a vacuum pump, followed by return to standard pressure. Next, the metallic mold 1, 2 and 3 shown in FIG. 1 was set up, a 0.05 mm thick polyethylene film cut into strips 4 was laid down in the mold cavity and the aluminum alloy piece described above was placed on top as 11. The procedure up to this point was the same as in Experiment example 26, while the CFRP prepreg fabricated in Experiment example 25 was used.

That is, three sheets of the prepreg in Experiment 25 that had been cut were built up in layers, then polyethylene film 13 was placed on the aluminum alloy side, following which five sheets of prepreg of a different size were again built up in layers. A PTFE weight 9 was then placed on top and the assembly was placed in a hot air dryer. Within the dryer, a 0.5 kg iron weight was placed on top of each PTEF block 9, following which the dryer was turned on and the temperature was raised to 135° C. Heating at 135° C. was carried out for 60 minutes, after which the temperature was raised further to 165° C. over a period of 10 minutes and the temperature was held at 165° C. for 60 minutes. The power was then turned off and the dryer was left to be in cooling state with the door closed. The next day, the assembly was taken out of the dryer, the shaped object was released from the mold and the polyethylene film was peeled off, giving the shaped object shown in FIG. 2.

On the second day after joining, the objects were subjected to tensile breaking tests. The CFRP portion was sandwiched between two pieces of 1 mm thick SUS304 stainless steel polished with sandpaper and the resulting assembly was secured by clamping between chuck plates. The average shear strength at break for the four pairs was 55 MPa, which was very strong. The joining surface area was calculated as l×m in FIG. 2.

What is claimed is:

1. An aluminum alloy composite comprising:
   a first metal part made of a first aluminum alloy having a micron-order surface roughness formed by chemical etching on a surface thereof, the surface having thereon a thin layer of aluminum oxide with a thickness of at least 2 nm that is free of sodium ions and the surface roughness having formed therein an ultrafine irregular surface formed of depressions or projections having 10 to 100 nm diameter and substantially equal depth or height, and
   an adherent part joined to the first metal part with an epoxy-based adhesive that has penetrated into the ultrafine irregular surface;
   wherein said micron-order surface roughness has a mean peak spacing: RSm of 0.8 to 10 μm and a maximum height: Rz of 0.2 to 5.0 μm;
   wherein said adherent part is a second metal part made of a second aluminum alloy having formed thereon said ultrafine irregular surface
   wherein said epoxy-based adhesive in the cured form includes a total of between 0 and 100 parts by weight of filler per 100 parts by weight of the total resin components, and
   wherein the shear strength at break with said first metal part and said second metal part is 44 to 70 MPa.

2. The aluminum alloy composite according to claim 1, wherein ultrafine etching to create said ultrafine irregular surface is carried out by immersion treatment in an aqueous solution containing at least one selected from the group consisting of hydrazine hydrate, ammonia and water-soluble amine compounds.

3. The aluminum alloy composite according to claim 1, wherein said epoxy-based adhesive in a cured form thereof contains 0 to 30 parts by weight of an elastomer component per 100 parts by weight of total resin components.

4. The aluminum alloy composite according to claim 3, wherein said filler is at least one type of reinforcing fiber selected from the group consisting of glass fibers, carbon fibers and aramid fibers and at least one type of powder filler selected from the group consisting of calcium carbonate, magnesium carbonate, silica, talc, clay and glass.

5. The aluminum alloy composite according to claim 3, wherein said elastomer component has a particle size of 1 to 15 μm and is of at least one type selected from the group consisting of vulcanized rubber powders, semi-crosslinked rubbers, unvulcanized rubbers, end-modified thermoplastic resins of a hydroxyl-terminated polyether sulfone which have a melting point or softening point of at least 300° C. and polyolefin resins.

6. The aluminum alloy composite according to claim 1, wherein the shear strength at break with said first metal part and said second metal part is 60 to 70 MPa.

7. The aluminum alloy composite according to claim 1, wherein the shear strength at break with said first metal part and said second metal part is 50 to 70 MPa.

* * * * *